(12) United States Patent
Kurokawa

(10) Patent No.: US 10,797,706 B2
(45) Date of Patent: Oct. 6, 2020

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/469,288

(22) PCT Filed: Dec. 14, 2017

(86) PCT No.: PCT/IB2017/057918
§ 371 (c)(1),
(2) Date: Jun. 13, 2019

(87) PCT Pub. No.: WO2018/122658
PCT Pub. Date: Jul. 5, 2018

(65) Prior Publication Data
US 2020/0036382 A1    Jan. 30, 2020

(30) Foreign Application Priority Data
Dec. 27, 2016 (JP) .................................. 2016-252694

(51) Int. Cl.
*H03K 19/177* (2020.01)
*G06F 7/38* (2006.01)
(Continued)

(52) U.S. Cl.
CPC ........ *H03K 19/1776* (2013.01); *G11C 11/401* (2013.01); *H01L 27/10808* (2013.01); *H03K 3/356113* (2013.01); *H03K 19/17728* (2013.01)

(58) Field of Classification Search
CPC .............................. H01L 11/401; G11C 11/401
See application file for complete search history.

(56) References Cited

U.S. PATENT DOCUMENTS

| 4,785,204 A | 11/1988 | Terada et al. |
| 5,640,105 A | 6/1997 | Sobelman et al. |

(Continued)

FOREIGN PATENT DOCUMENTS

| JP | 2002-164779 A | 6/2002 |
| JP | 2002-252558 A | 9/2002 |

(Continued)

OTHER PUBLICATIONS

Aoki.T et al., "Normally-Off Computing with Crystalline InGaZnO-based FPGA", ISSCC 2014 (Digest of Technical Papers. IEEE International Solid-State Circuits Conference), Feb. 12, 2014, vol. 2014, pp. 502-504.

(Continued)

*Primary Examiner* — Anh Q Tran
(74) *Attorney, Agent, or Firm* — Fish & Richardson P.C.

(57) ABSTRACT

A programmable logic device including an asynchronous circuit is provided. The programmable logic device includes a lookup table, a first circuit, and a second circuit. The first circuit receives a first signal and a second signal. The second circuit sends a third signal. The first circuit sends a fourth signal and a fifth signal, when receiving the third signal. The fourth signal has the same logic as the first signal. The fifth signal has the same logic as the second signal. The lookup table sends a sixth signal and a seventh signal, when receiving the fourth signal and the fifth signal. The second circuit sends an eighth signal, when receiving the sixth signal and the seventh signal. The first circuit sends a ninth signal, when receiving the eighth signal. The lookup table (Continued)

includes a memory. The sixth signal and the seventh signal are generated from data stored in the memory.

12 Claims, 21 Drawing Sheets

(51) Int. Cl.
 *H03K 19/094*  (2006.01)
 *H03K 19/1776* (2020.01)
 *G11C 11/401*  (2006.01)
 *H01L 27/108*  (2006.01)
 *H03K 3/356*  (2006.01)
 *H03K 19/17728* (2020.01)

(56) References Cited

U.S. PATENT DOCUMENTS

| | | | |
|---|---|---|---|
| 6,262,593 B1 | 7/2001 | Sobelman et al. | |
| 6,292,021 B1 * | 9/2001 | Furtek | H03K 19/1735 326/41 |
| 6,654,944 B1 | 11/2003 | Dike | |
| 6,900,658 B1 | 5/2005 | Sobelman et al. | |
| 6,961,741 B2 * | 11/2005 | Swami | G06F 1/0356 708/235 |
| 7,330,054 B1 | 2/2008 | Masleid | |
| 7,451,384 B2 | 11/2008 | Erstad et al. | |
| 7,554,374 B2 | 6/2009 | Fairbanks | |
| 7,635,989 B1 | 12/2009 | Young | |
| 7,759,974 B1 | 7/2010 | Young | |
| 7,982,496 B1 | 7/2011 | Young | |
| 8,455,868 B2 | 6/2013 | Yamazaki et al. | |
| 9,064,574 B2 | 6/2015 | Aoki et al. | |
| 9,111,051 B2 | 8/2015 | Hanyu et al. | |
| 9,349,735 B2 | 5/2016 | Yamazaki et al. | |
| 9,490,789 B1 | 11/2016 | Tian et al. | |
| 10,033,357 B2 | 7/2018 | Kanno et al. | |
| 2002/0017924 A1 | 2/2002 | Knowles | |
| 2004/0130349 A1 | 7/2004 | Morgenshtein et al. | |
| 2004/0257108 A1 | 12/2004 | Carlson et al. | |
| 2005/0077918 A1 | 4/2005 | Teifel et al. | |
| 2007/0016823 A1 | 1/2007 | Jang et al. | |
| 2008/0290897 A1 * | 11/2008 | Lewis | H03K 19/17728 326/39 |
| 2010/0097131 A1 | 4/2010 | Bainbridge et al. | |
| 2010/0231263 A1 | 9/2010 | Fish et al. | |
| 2011/0156027 A1 | 6/2011 | Yamazaki et al. | |
| 2011/0291696 A1 | 12/2011 | Clerc et al. | |
| 2012/0274356 A1 | 11/2012 | Takahashi | |
| 2012/0294102 A1 | 11/2012 | Ishizu | |
| 2013/0134416 A1 | 5/2013 | Nishijima et al. | |
| 2013/0191673 A1 | 7/2013 | Koyama et al. | |
| 2013/0235689 A1 | 9/2013 | Koyama | |
| 2013/0262828 A1 | 10/2013 | Yoneda | |
| 2013/0262896 A1 | 10/2013 | Yoneda | |
| 2013/0270551 A1 | 10/2013 | Yoneda | |
| 2013/0285711 A1 | 10/2013 | Miyake | |
| 2013/0293266 A1 | 11/2013 | Takemura | |
| 2013/0297874 A1 | 11/2013 | Kurokawa | |
| 2013/0297952 A1 | 11/2013 | Miyake | |
| 2013/0315011 A1 | 11/2013 | Takahashi et al. | |
| 2013/0315021 A1 | 11/2013 | Kondo et al. | |
| 2013/0326244 A1 | 12/2013 | Koyama et al. | |
| 2014/0015564 A1 | 1/2014 | Cannon et al. | |
| 2014/0025978 A1 | 1/2014 | Tokunaga | |
| 2014/0068300 A1 | 3/2014 | Nishijima et al. | |
| 2014/0108836 A1 | 4/2014 | Nishijima et al. | |
| 2014/0126271 A1 | 5/2014 | Aoki et al. | |
| 2014/0159771 A1 | 6/2014 | Ikeda et al. | |
| 2014/0208142 A1 | 7/2014 | Tamura | |
| 2014/0247069 A1 | 9/2014 | Gill et al. | |
| 2014/0325171 A1 | 10/2014 | Yoneda | |
| 2014/0340127 A1 | 11/2014 | Kobayashi et al. | |
| 2014/0340134 A1 | 11/2014 | Shionoiri | |
| 2014/0368235 A1 | 12/2014 | Aoki et al. | |
| 2015/0103611 A1 | 4/2015 | Ishizu | |
| 2015/0117093 A1 | 4/2015 | Onuki et al. | |
| 2015/0269977 A1 | 9/2015 | Ishizu et al. | |
| 2015/0370313 A1 | 12/2015 | Tamura | |
| 2016/0006433 A1 | 1/2016 | Ishizu et al. | |
| 2016/0043716 A1 | 2/2016 | Kurokawa et al. | |
| 2016/0071587 A1 | 3/2016 | Di Pendina et al. | |
| 2016/0217848 A1 | 7/2016 | Ishizu et al. | |
| 2016/0226490 A1 | 8/2016 | Kozuma et al. | |
| 2016/0232956 A1 | 8/2016 | Ishizu et al. | |
| 2016/0233866 A1 | 8/2016 | Ishizu et al. | |
| 2016/0254803 A1 | 9/2016 | Kanno et al. | |
| 2016/0260718 A1 | 9/2016 | Yamazaki et al. | |
| 2016/0301932 A1 | 10/2016 | Kurokawa | |
| 2016/0379564 A1 | 12/2016 | Inoue et al. | |
| 2017/0187357 A1 | 6/2017 | Tamura | |
| 2017/0248128 A1 | 8/2017 | Koyama et al. | |
| 2018/0026612 A1 | 1/2018 | Kurokawa | |

FOREIGN PATENT DOCUMENTS

| | | |
|---|---|---|
| WO | WO-2010/039312 | 4/2010 |
| WO | WO-2011/077967 | 6/2011 |
| WO | WO-2011/149066 | 12/2011 |
| WO | WO-2014/073374 | 5/2014 |
| WO | WO-2015/056314 | 4/2015 |

OTHER PUBLICATIONS

International Search Report (Application No. PCT/IB2017/057918) dated Feb. 13, 2018.

Written Opinion (Application No. PCT/IB2017/057918) dated Feb. 13, 2018.

* cited by examiner

FIG. 2A
10
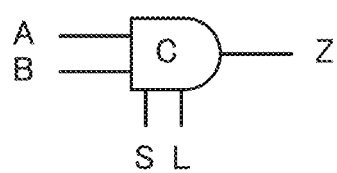
FIG. 2B
| A | B | Z  |
|---|---|----|
| 0 | 0 | 0  |
| 1 | 1 | 1  |
| 0 | 1 | Z' |
| 1 | 0 | Z' |
FIG. 2C
13
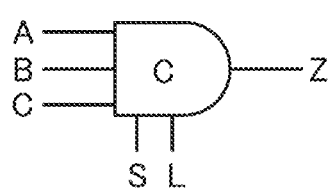
FIG. 2D
| A | B | C | Z  |
|---|---|---|----|
| 0 | 0 | 0 | 0  |
| 1 | 0 | 0 | Z' |
| 0 | 1 | 0 | Z' |
| 1 | 1 | 0 | Z' |
| 0 | 0 | 1 | Z' |
| 1 | 0 | 1 | Z' |
| 0 | 1 | 1 | Z' |
| 1 | 1 | 1 | 1  |

70

FIG. 22A
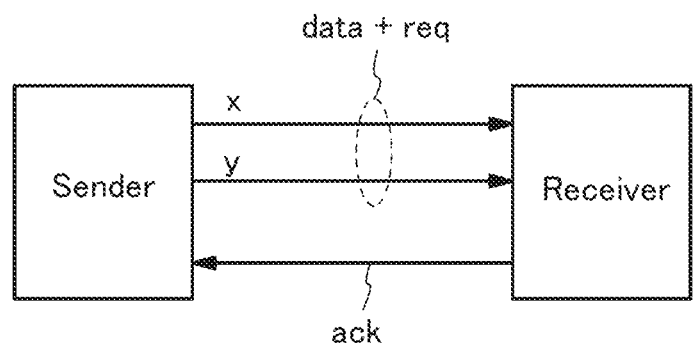
FIG. 22B
|  | (x, y) |
|---|---|
| spacer | (0, 0) |
| "0" | (1, 0) |
| "1" | (0, 1) |
| inhibit | (1, 1) |
FIG. 22C
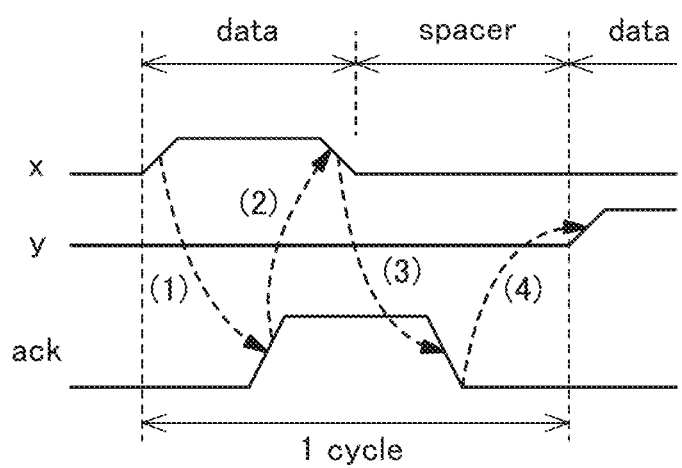

SEMICONDUCTOR DEVICE

TECHNICAL FIELD

One embodiment of the present invention relates to a semiconductor device. One embodiment of the present invention particularly relates to a programmable logic device.

One embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a memory device, an electro-optical device, a power storage device, a semiconductor circuit, and an electronic device each may include a semiconductor device.

BACKGROUND ART

In recent years, transistors containing oxide semiconductors or metal oxides in their channel formation regions (oxide semiconductor transistors or OS transistors) have attracted attention. An OS transistor has an extremely low off-state current. Applications that employ OS transistors to utilize their low off-state currents have been proposed.

For example, Patent Document 1 and Non-Patent Document 1 have disclosed a programmable logic device (PLD) provided with a nonvolatile configuration memory including an OS transistor.

A PLD includes a plurality of programmable logic elements (PLEs) and a plurality of programmable switch elements (PSEs). In the PLD, data on functions of the PLEs and data on connections between the PLEs by the PSEs are stored in a configuration memory as configuration data.

LSI mainly employs synchronous circuits, in which data in flip-flops is updated in synchronization with the rising edge or the falling edge of a clock signal. Synchronous circuits have an advantage such as the ease of designing, but have a disadvantage of instantaneous increase in power consumption because circuits operate simultaneously in synchronization with a clock signal. Synchronous circuits also have a disadvantage in that the cost for layout design is increased because a clock signal needs to be distributed among components of the circuits without delay.

To eliminate the above disadvantages of synchronous circuits, asynchronous circuits are employed, in which data is transmitted and received between circuit portions without using a clock signal by a method called "handshake". As a communication protocol for asynchronous circuits, a four-phase dual-rail protocol is known, in which dual-rail encoding and four-phase encoding are used in combination (see Patent Document 2). The four-phase dual-rail protocol is described below with reference to FIGS. 22A to 22C.

FIG. 22A is a block diagram showing the concept of the four-phase dual-rail protocol. As shown in FIG. 22A, data is communicated by two signal lines x and y. A sender sends data to a receiver. In response to a request (req) from the sender, the receiver sends back an acknowledgment signal (ack) to the sender to signify the receipt of the data.

FIG. 22B shows a truth table of the four-phase dual-rail protocol. In dual-rail encoding, 1-bit data is expressed using two signal lines. A state where (x, y)=(1, 0) means that data is "0". A state where (x, y)=(0, 1) means that data is "1". A state where (x, y)=(0, 0) is called "spacer" that is used to delimit consecutive data. A state where (x, y)=(1, 1) is called "inhibit" that is an invalid value that a circuit cannot have according to the operating principle.

FIG. 22C is a timing chart showing a communication procedure for the four-phase dual-rail protocol. In the four-phase dual-rail protocol, data ("0" or "1") and a spacer are alternately used. First, the sender identifies an acknowledgement signal from the receiver and sends data to the receiver (1). In FIG. 22C, data "0" is sent as an example. Next, the receiver detects the data and sends an acknowledgement signal to the sender (2). Then, the sender identifies the acknowledgement signal and sends a spacer to the receiver (3). The receiver detects the spacer and sends an acknowledgement signal to the sender (4). In such a manner, the four-phase dual-rail protocol requires four steps to complete one data transfer.

REFERENCE

Patent Document

Patent Document 1: United States Patent Application Publication No. 2014/0159771
Patent Document 2: PCT International Publication No. 2011/149066

Non-Patent Document

Non-Patent Document 1: T. Aoki et al., "Normally-Off Computing with Crystalline InGaZnO-based FPGA", IEEE ISSCC Dig. Tech. Papers, 2014, pp. 502-503.

DISCLOSURE OF INVENTION

An object of one embodiment of the present invention is to provide a programmable logic device including an asynchronous circuit. Another object of one embodiment of the present invention is to provide a programmable logic device with low power consumption. Another object of one embodiment of the present invention is to provide a semiconductor device with low power consumption. Another object of one embodiment of the present invention is to provide a novel semiconductor device.

Note that the description of a plurality of objects does not mutually preclude the existence. One embodiment of the present invention does not necessarily achieve all the objects. Objects other than those listed above are apparent from the description of the specification, drawings, claims, and the like, and also such objects could be an object of one embodiment of the present invention.

One embodiment of the present invention is a semiconductor device including a lookup table, a first circuit, and a second circuit. The lookup table includes a memory. The first circuit receives a first signal and a second signal. The second circuit sends a third signal. The first circuit sends a fourth signal and a fifth signal, when receiving the third signal. The fourth signal has the same logic (0 or 1) as the first signal, and the fifth signal has the same logic (0 or 1) as the second signal. The lookup table sends a sixth signal and a seventh signal, when receiving the fourth signal and the fifth signal. The second circuit sends an eighth signal, when receiving the sixth signal and the seventh signal. The first circuit sends a ninth signal, when receiving the eighth signal. The sixth signal and the seventh signal are generated from data stored in the memory.

In the above embodiment, supply of a power supply voltage to the lookup table is stopped by the ninth signal.

In the above embodiment, the memory preferably includes a transistor that contains a metal oxide in its channel formation region.

In the above embodiment, each of the first circuit and the second circuit preferably includes a first transistor, a second transistor, a third transistor, a fourth transistor, a latch circuit, and a memory circuit. The first transistor is an n-channel transistor. The second transistor is an n-channel transistor. The third transistor is a p-channel transistor. The fourth transistor is a p-channel transistor. One of a source and a drain of the first transistor is supplied with a low power supply potential. The other of the source and the drain of the first transistor is electrically connected to one of a source and a drain of the second transistor. The other of the source and the drain of the second transistor is electrically connected to one of a source and a drain of the third transistor. The other of the source and the drain of the third transistor is electrically connected to one of a source and a drain of the fourth transistor. The other of the source and the drain of the fourth transistor is supplied with a high power supply potential. A gate of the first transistor is electrically connected to a gate of the fourth transistor. A gate of the second transistor is electrically connected to a gate of the third transistor. The latch circuit includes a first node and a second node. The first node is electrically connected to the one of the source and the drain of the third transistor. The second node is supplied with an inverted signal of a signal supplied to the first node. The memory circuit is preferably configured to store data that the latch circuit stores before supply of a power supply voltage to the latch circuit is stopped, while the supply of the power supply voltage is stopped.

In the above embodiment, the memory circuit preferably includes a transistor that contains a metal oxide in its channel formation region.

One embodiment of the present invention is a programmable logic device that includes a programmable switch element and a programmable logic element including the above-described semiconductor device.

One embodiment of the present invention is an operation method of a semiconductor device including a lookup table, a first circuit, and a second circuit. The first circuit receives a first signal and a second signal. The second circuit sends a third signal. The first circuit sends a fourth signal and a fifth signal, when receiving the third signal. The fourth signal has the same logic (0 or 1) as the first signal, and the fifth signal has the same logic (0 or 1) as the second signal. The lookup table sends a sixth signal and a seventh signal, when receiving the fourth signal and the fifth signal. The second circuit sends an eighth signal, when receiving the sixth signal and the seventh signal. The first signal sends a ninth signal, when receiving the eighth signal. The lookup table includes a memory. The sixth signal and the seventh signal are generated from data stored in the memory.

In the above embodiment, supply of a power supply voltage to the lookup table is preferably stopped by the ninth signal.

According to one embodiment of the present invention, a programmable logic device including an asynchronous circuit can be provided. According to one embodiment of the present invention, a programmable logic device with low power consumption can be provided. According to one embodiment of the present invention, a semiconductor device with low power consumption can be provided. According to one embodiment of the present invention, a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 2A and 2C each illustrate a symbol representing a semiconductor device, and FIGS. 2B and 2D are each a truth table of the corresponding semiconductor device;

FIGS. 22A to 22C are diagrams for explaining a four-phase dual-rail protocol.

BEST MODE FOR CARRYING OUT THE INVENTION

Figure 1A:
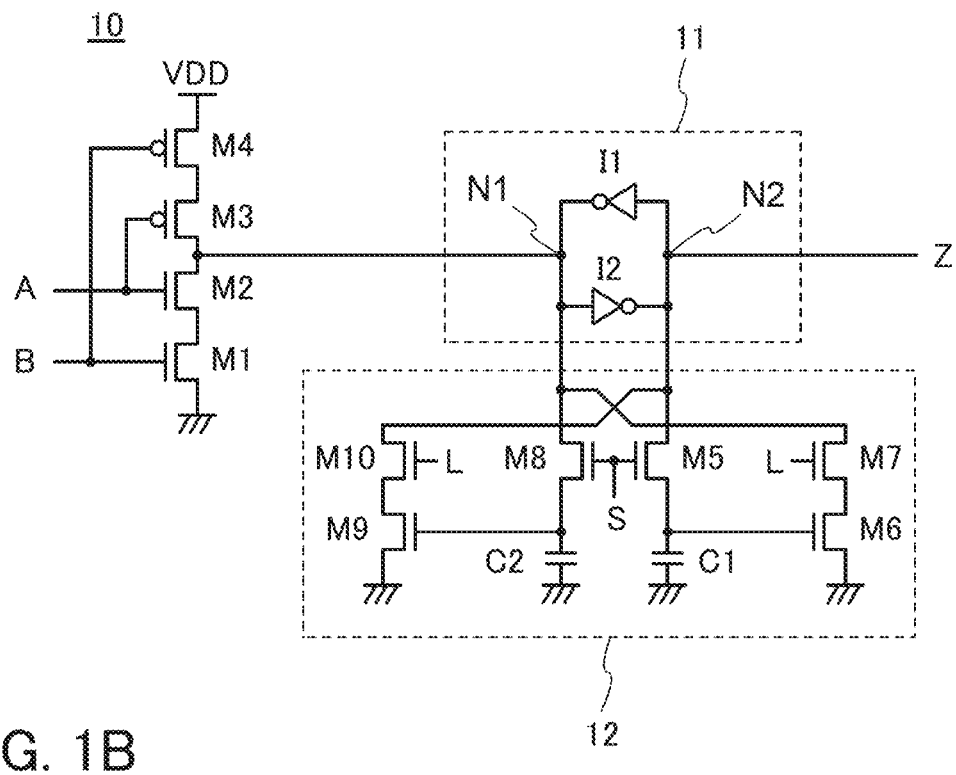
FIGS. 1A and 1B are circuit diagrams illustrating configuration examples of semiconductor devices.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

In this specification, a high power supply voltage is referred to as H level and a low power supply voltage is referred to as L level in some cases. In addition, a wiring through which the H level is supplied is referred to as VDD and a wiring through which the L level is supplied is referred to as GND in some cases.

Furthermore, in the present specification, any of the embodiments described below can be combined as appropriate. In addition, in the case where a plurality of structure examples are described in one embodiment, some of the structure examples can be combined as appropriate.

Embodiment 1

This embodiment will describe a programmable logic device including an asynchronous circuit of one embodiment of the present invention.

<<Basic Circuits>>

First, basic circuits included in a programmable logic device are described.

A semiconductor device 10 shown in FIG. 1A is a basic circuit included in an asynchronous circuit. The semiconductor device 10 includes transistors M1 to M10, a capacitor C1, a capacitor C2, an inverter I1, and an inverter I2. In the drawing, a circuit portion including the inverters I1 and I2 is referred to as a latch circuit 11, and a circuit portion including the transistors M5 to M10, the capacitor C1, and the capacitor C2 is referred to as a memory circuit 12.

Among the transistors M1 to M10, the transistors M3 and M4 are p-channel transistors and the other transistors are n-channel transistors in the following description.

A node of an output terminal of the inverter I1 and an input terminal of the inverter I2 is referred to as a node N1. A node of an input terminal of the inverter I1 and an output terminal of the inverter I2 is referred to as a node N2. A signal Z is output from the node N2.

One of a source and a drain of the transistor M1 is electrically connected to GND. The other of the source and the drain the transistor M1 is electrically connected to one of a source and a drain of the transistor M2. The other of the source and the drain the transistor M2 is electrically connected to one of a source and a drain of the transistor M3. The other of the source and the drain the transistor M3 is electrically connected to one of a source and a drain of the transistor M4. The other of the source and the drain the transistor M4 is electrically connected to VDD.

A gate of the transistor M2 and a gate of the transistor M3 are electrically connected to each other and are supplied with a signal A. A gate of the transistor M1 and a gate of the transistor M4 are electrically connected to each other and are supplied with a signal B. The one of the source and the drain the transistor M3 is electrically connected to the node N1.

A first terminal of the capacitor C1 is electrically connected to GND. A second terminal of the capacitor C1 is electrically connected to one of a source and a drain of the transistor M5. The other of the source and the drain of the transistor M5 is electrically connected to the node N2. A gate of the transistor M5 is supplied with a signal S.

One of a source and a drain of the transistor M6 is electrically connected to GND. The other of the source and the drain the transistor M6 is electrically connected to one of a source and a drain of the transistor M7. The other of the source and the drain the transistor M7 is electrically connected to the node N1. A gate of the transistor M6 is electrically connected to the second terminal of the capacitor C1. A gate of the transistor M7 is supplied with a signal L.

A first terminal of the capacitor C2 is electrically connected to GND. A second terminal of the capacitor C2 is electrically connected to one of a source and a drain of the transistor M8. The other of the source and the drain of the transistor M8 is electrically connected to the node N1. A gate of the transistor M8 is supplied with the signal S.

One of a source and a drain of the transistor M9 is electrically connected to GND. The other of the source and the drain the transistor M9 is electrically connected to one of a source and a drain of the transistor M10. The other of the source and the drain the transistor M10 is electrically connected to the node N2. A gate of the transistor M9 is electrically connected to the second terminal of the capacitor C2. A gate of the transistor M10 is supplied with the signal L.

The semiconductor device 10 outputs Z=0 when (A, B)=(0, 0), outputs Z=1 when (A, B)=(1, 1), and holds the previous value as Z when (A, B)=(0, 1) or (1, 0).

The latch circuit 11 has a function of storing 1-bit data. The node N1 and the node N2 have functions of holding signals that are inverted from each other.

The memory circuit 12 has a function of storing data held in the latch circuit 11. In the semiconductor device 10, when S=1 is set, a potential corresponding to data held in the latch circuit 11 is stored in the capacitors C1 and C2. When L=1 is set, data corresponding to the potential stored in the capacitors C1 and C2, i.e., the data that is originally held in the latch circuit 11 can be returned to the latch circuit 11.

The transistors M5 and M8 are preferably OS transistors, in which case the off-state current of the transistors M5 and M8 can be extremely low. Accordingly, data stored in the capacitor C1 can be held for a long time by turning off the transistor M5, and data stored in the capacitor C2 can be held for a long time by turning off the transistor M8, for example. In other words, the memory circuit 12 functions as a nonvolatile register.

The transistors M5 to M10 may be OS transistors, in which case the memory circuit 12 composed of the OS transistors can be stacked over the latch circuit 11 composed of Si transistors, leading to a smaller circuit area.

Alternatively, the transistors M5 and M8 may be OS transistors and the transistors M6, M7, M9, and M10 may be Si transistors. In this case, data in the memory circuit 12 can be returned to the latch circuit 11 at higher speed.

Further alternatively, the transistor M5, the transistor M8, one of the transistors M6 and M7, and one of the transistors M9 and M10 may be OS transistors and the other of the transistors M6 and M7 and the other of the transistors M9 and M10 may be Si transistors. In this case, static leakage current of the memory circuit 12 can be reduced, and data retention in the latch circuit 11 can be stable.

An OS transistor preferably contains an oxide semiconductor or a metal oxide in a channel formation region. An oxide semiconductor or a metal oxide used for an OS transistor is preferably an oxide containing at least one of indium (In) and zinc (Zn). Typical examples of such oxides include In-M-Zn oxide, In-M oxide, Zn-M oxide, and In—Zn oxide, where the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example. The off-state current per channel width of 1 µm of an OS transistor can be low and approximately from 1 yA/µm (y: yocto, $10^{-24}$) to 1 zA/µm (z: zepto, $10^{-21}$).

It is preferable to use cloud-aligned composite (CAC) OS for the OS transistor. Note that the details of the CAC-OS will be described later in Embodiment 3.

In the semiconductor device 10, supply of the power supply voltage may be stopped after data held in the latch circuit 11 is saved in the memory circuit 12. In this case, the memory circuit 12 serves as a nonvolatile memory and keeps storing the data even without supply of the power supply voltage. When supply of the power supply voltage resumes, the data in the memory circuit 12 is returned to the latch circuit 11.

Accordingly, the semiconductor device 10 can be powered off in a proactive manner when data is not updated, resulting in lower power consumption.

Figure 1B:
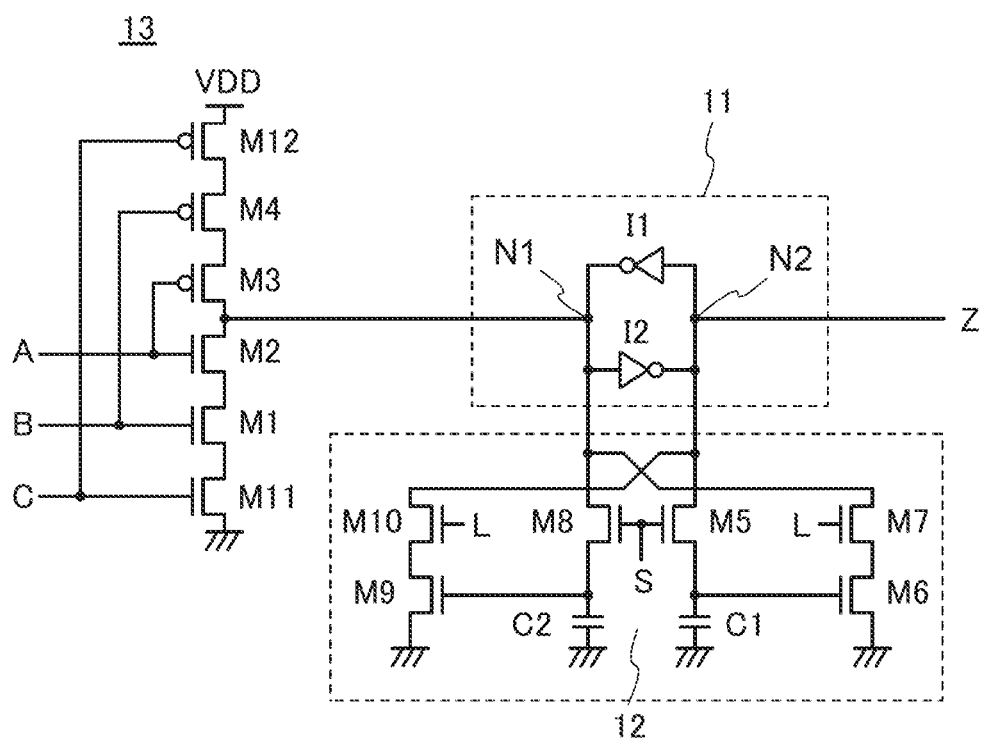

A semiconductor device 13 shown in FIG. 1B is configured such that a transistor M11 is additionally provided between the transistor M1 and GND and a transistor M12 is additionally provided between the transistor M4 and VDD in the semiconductor device 10. The transistor M11 is an n-channel transistor, and the transistor M12 is a p-channel transistor.

In the semiconductor device 13, the gate of the transistor M2 and the gate of the transistor M3 are electrically connected to each other and are supplied with the signal A. The gate of the transistor M1 and the gate of the transistor M4 are electrically connected to each other and are supplied with the signal B. A gate of the transistor M11 and a gate of the transistor M12 are electrically connected to each other and are supplied with a signal C.

FIG. 2A shows a symbol of the semiconductor device 10 in FIG. 1A. FIG. 2B shows a truth table of the semiconductor device 10. In the table, 1 represents "true", 0 represents "false", and Z' means a state of keeping the previous state.

FIG. 2C shows a symbol of the semiconductor device 13 in FIG. 1B. FIG. 2D shows a truth table of the semiconductor device 13. The characters in FIG. 2D represent the same meanings as those in FIG. 2B.

It is seen from FIGS. 2B and 2D that the semiconductor devices 10 and 13 each have a function of the Muller C-element, which is frequently used in asynchronous circuits. Specifically, the semiconductor device 10 is a two-input nonvolatile Muller C-element, in which the memory circuit 12 is added to a two-input Muller C-element composed of the transistors M1 to M4 and the latch circuit 11. The semiconductor device 13 is a three-input nonvolatile Muller C-element, in which the memory circuit 12 is added to a three-input Muller C-element composed of the transistors M1 to M4, M11, and M12 and the latch circuit 11. In a similar manner, it is possible to provide a multi-input nonvolatile Muller C-element configured with the memory circuit 12 and a Muller C-element with more inputs. Note that a Muller C-element in the semiconductor devices 10 and 13 can employ any other configuration having the same function.

<<Half-Buffer>>

Figure 3A:
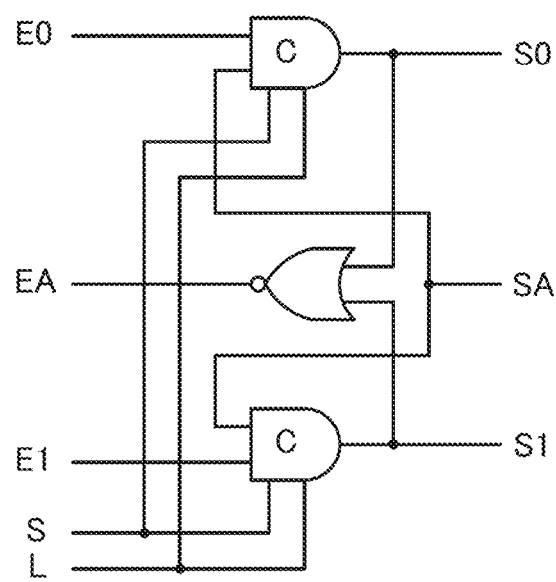
FIG. 3A is a circuit diagram illustrating a configuration example of a semiconductor device.
Figure 3B:
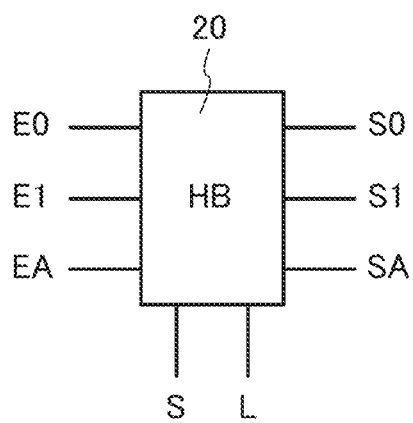
FIG. 3B illustrates a symbol representing a semiconductor device.

FIG. 3A illustrates a semiconductor device 20 as an example of a buffer formed using the semiconductor device 10. The semiconductor device 20 is referred to as a half-buffer (HB) in some cases. The semiconductor device 20 includes two semiconductor devices 10 and one NOR gate. FIG. 3B shows a symbol of the semiconductor device 20. A signal SA, a signal E0, and a signal E1 are signals input to the semiconductor device 20. A signal EA, a signal S0, and a signal S1 are signals output from the semiconductor device 20.

Figure 4A:
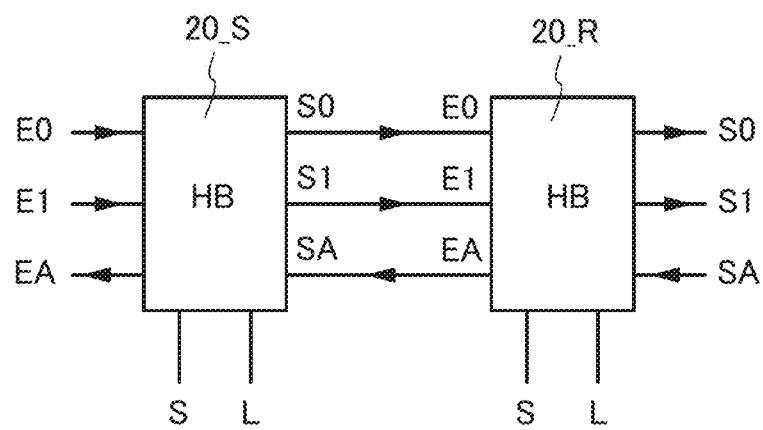
FIG. 4A is a circuit diagram of a semiconductor device.

FIG. 4A illustrates an example where two semiconductor devices 20 are connected to each other. A semiconductor device 20_S indicates a sender, and a semiconductor device 20_R indicates a receiver. The signal S0 of the semiconductor device 20_S corresponds to the signal E0 of the semiconductor device 20_R, the signal S1 of the semiconductor device 20_S corresponds to the signal E1 of the semiconductor device 20_R, and the signal EA of the semiconductor device 20_R corresponds to the signal SA of the semiconductor device 20_S.

The pair of signals (E0, E1) and the pair of signals (S0, S1) correspond to "two rails" in the four-phase dual-rail protocol described above, and each pair corresponds to (x, y) in FIGS. 22A to 22C. The pair of signals (E0, E1) and the pair of signals (S0, S1) contain 1-bit data.

Hereinafter, the state where (E0, E1)=(1, 0) and (S0, S1)=(1, 0) is referred to as data "0," the state where (E0, E1)=(0, 1) and (S0, S1)=(0, 1) as data "1," and the state where (E0, E1)=(0, 0) and (S0, S1)=(0, 0) as "spacer" in some cases. Unless otherwise specified, a simple term "data" means the aforementioned data "0" or data "1".

The signals EA and SA correspond to the acknowledgement signal (ack) in FIGS. 22A and 22C. Specifically, the logic of the signals EA and SA corresponds to the inverted logic of the acknowledgement signal (ack) in FIGS. 22A and 22C.

Next, signals input to and output from the semiconductor device 20 will be described using FIGS. 5A to 5F. Note that FIGS. 5A to 5F merely show typical examples for explaining operations of the semiconductor device 20 and do not illustrate all the operations of the semiconductor device 20.

Figure 5A:
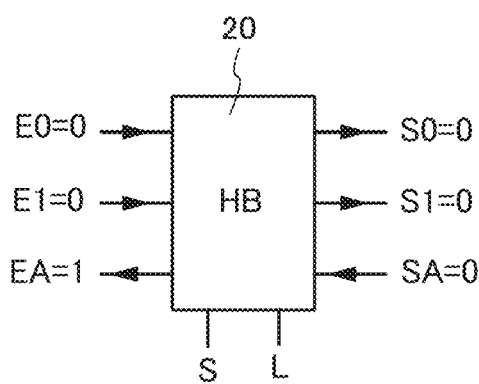
FIGS. 5A to 5F are diagrams illustrating operation examples of a semiconductor device.
Figure 5B:
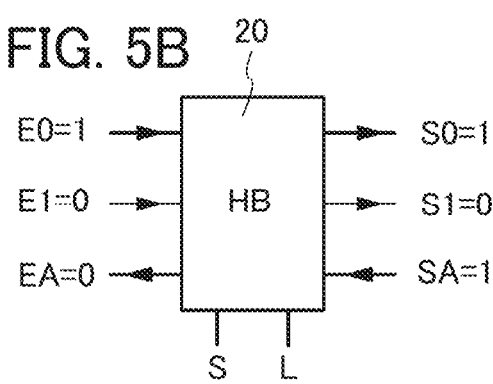
Figure 5C:
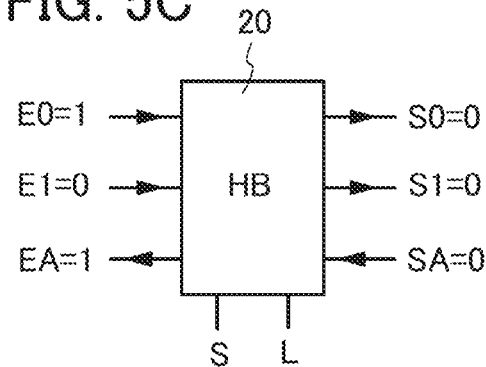

First, the case where the output of the semiconductor device 20 is switched from a spacer to data is described using FIGS. 5A to 5C.

FIG. 5A shows the case where SA=0 and a spacer ((E0, E1)=(0, 0)) are input to the semiconductor device 20 and the semiconductor device 20 outputs EA=1 and a spacer ((S0, S1)=(0, 0)).

FIG. 5B shows the case where SA=1 and data "0" ((E0, E1)=(1, 0)) are input to the semiconductor device 20 that is in the state of FIG. 5A. FIG. 5C shows the case where SA=0 and the data "0" are input to the semiconductor device 20 that is in the state of FIG. 5A.

In FIG. 5B, the semiconductor device 20 outputs EA=0 and data "0" ((S0, S1)=(1, 0)). This indicates that the output reflects the input and data is updated correctly.

In contrast, in FIG. 5C, the semiconductor device 20 outputs EA=1 and a spacer ((S0, S1)=(0, 0)). This indicates that the output does not reflect the input and data is not correctly updated.

As shown in FIGS. 5A to 5C, when SA=1, the semiconductor device 20 accepts the input of data and can update the output signal from the spacer to the data; whereas when SA=0, the semiconductor device 20 does not accept the input of data and thus cannot update the output signal from the spacer to the data.

Figure 5D:
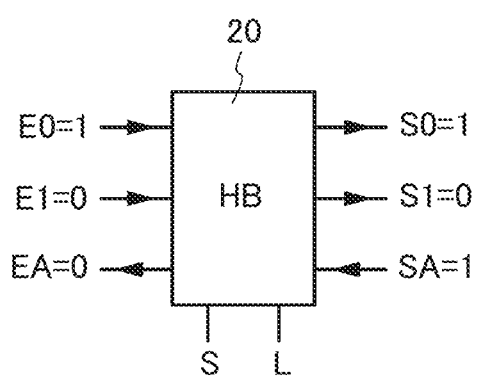
Figure 5E:
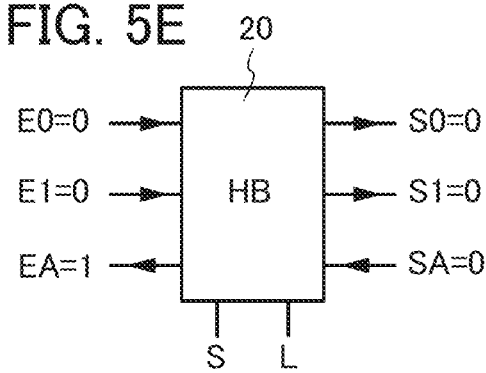
Figure 5F:
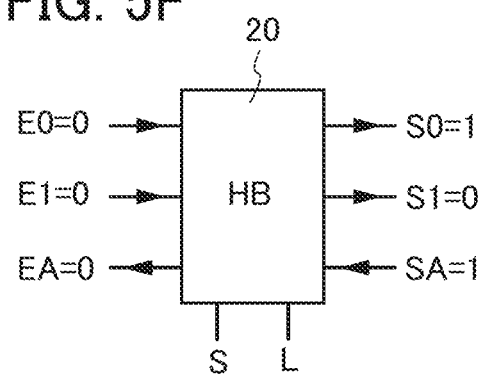

Next, the case where the output of the semiconductor device 20 is switched from data to a spacer is described using FIGS. 5D to 5F.

FIG. 5D shows the case where SA=1 and data "0" ((E0, E1)=(1, 0)) are input to the semiconductor device 20 and the semiconductor device 20 outputs EA=0 and data "0" ((S0, S1)=(1, 0)).

FIG. 5E shows the case where SA=0 and a spacer ((E0, E1)=(0, 0)) are input to the semiconductor device 20 that is in the state of FIG. 5D. FIG. 5F shows the case where SA=1 and the spacer are input to the semiconductor device 20 that is in the state of FIG. 5D.

In FIG. 5E, the semiconductor device 20 outputs EA=1 and a spacer ((S0, S1)=(0, 0)). This indicates that the output reflects the input and data is updated correctly.

In contrast, in FIG. 5F, the semiconductor device 20 outputs EA=0 and data "0" ((S0, S1)=(1, 0)). This indicates that the output does not reflect the input and data is not correctly updated.

As shown in FIGS. 5D to 5F, when SA=0, the semiconductor device 20 accepts the input of a spacer and can update the output signal from the data to the spacer; whereas when SA=1, the semiconductor device 20 does not accept the input of a spacer and thus cannot update the output signal from the data to the spacer.

In summary, when SA=1, the semiconductor device 20 accepts only a change in input from a spacer to data, and changes its output from a spacer to data. Meanwhile, when SA=0, the semiconductor device 20 accepts only a change in input from data to a spacer, and changes its output from data to a spacer.

Then, the semiconductor device 20_S and the semiconductor device 20_R shown in FIG. 4A are described again.

Figure 4B:
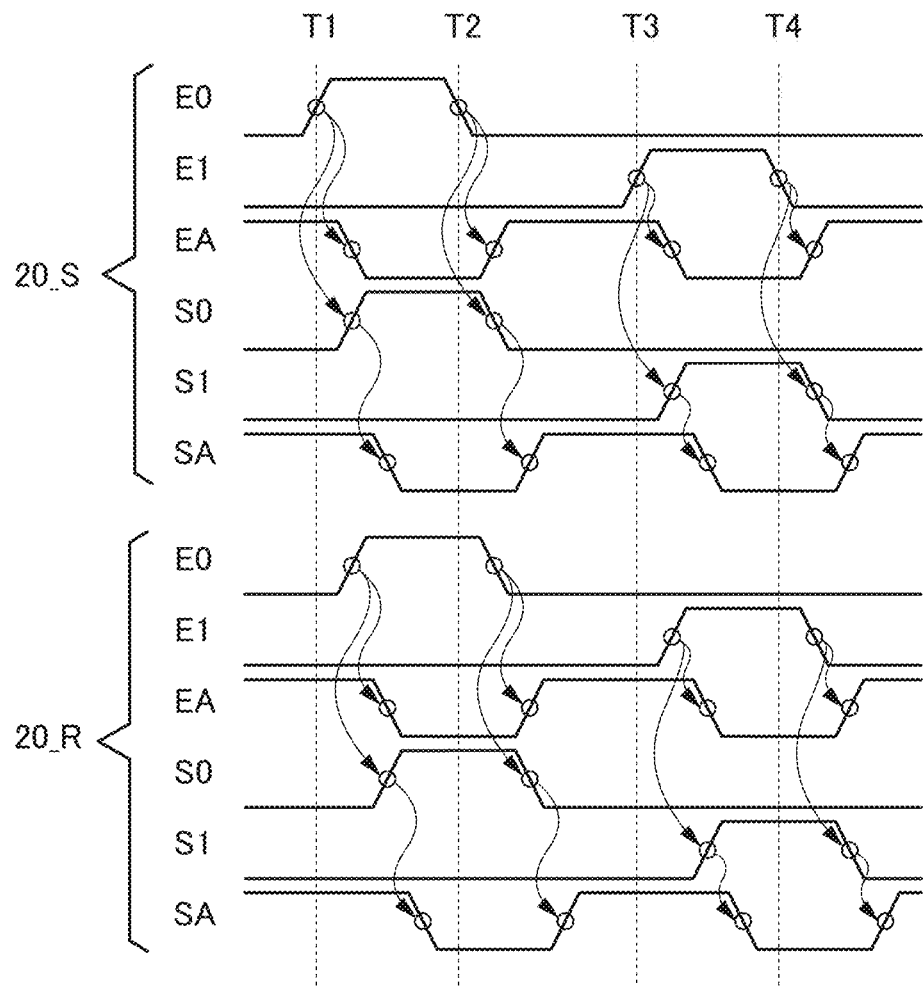
FIG. 4B is a timing chart illustrating an operation example of the semiconductor device.

FIG. 4B is a timing chart showing an operation example of the semiconductor device of FIG. 4A. In FIG. 4B, time T1 to time T4 are shown to indicate the operation timings. As an initial state, (E0, E1, SA, S0, S1, EA)=(0, 0, 1, 0, 0, 1) is set in both the semiconductor device 20_S and the semiconductor device 20_R.

At the time T1, (E0, E1) in the semiconductor device 20_S is changed from (0, 0) to (1, 0). That is, data "0" is input to the semiconductor device 20_S. Since SA=1 at this time, the semiconductor device 20_S outputs (S0, S1, EA)= (1, 0, 0) after a certain delay time. That is, the semiconductor device 20_S updates the output signal to data "0".

In response to the output of the semiconductor device 20_S, the semiconductor device 20_R also outputs (S0, S1, EA)=(1, 0, 0) after a certain delay time. That is, the semiconductor device 20_R also updates the output signal to data "0". The semiconductor device 20_S receives SA=0. Accordingly, the semiconductor device 20_S becomes capable of updating the output to a spacer.

At the time T2, (E0, E1) in the semiconductor device 20_S is changed from (1, 0) to (0, 0). That is, a spacer is input to the semiconductor device 20_S. Since SA=0 at this time, the semiconductor device 20_S outputs (S0, S1, EA)= (0, 0, 1) after a certain delay time. That is, the semiconductor device 20_S updates the output signal from the data to a spacer.

In response to the output of the semiconductor device 20_S, the semiconductor device 20_R also outputs (S0, S1, EA)=(0, 0, 1) after a certain delay time. That is, the semiconductor device 20_R also updates the output signal from data to a spacer. The semiconductor device 20_S receives SA=1. Accordingly, the semiconductor device 20_S becomes capable of updating the output from the spacer to data.

At the time T3, (E0, E1) in the semiconductor device 20_S is changed from (0, 0) to (0, 1). That is, data "1" is input to the semiconductor device 20_S. Since SA=1 at this time, the semiconductor device 20_S outputs (S0, S1, EA)= (0, 1, 0) after a certain delay time. That is, the semiconductor device 20_S updates the output signal from the spacer to data.

The subsequent operations are similar to the above; therefore, the description is omitted.

Note that the above delay time depends on parasitic resistance of a wiring, parasitic capacitance, driving capability of a previous-stage circuit, capacitance of a next-stage circuit, or the like. The semiconductor device 20 can be designed appropriately such that it has a margin allowing a stable output change in response to an input change.

When updating the output signal from the spacer to data, the semiconductor device 20_R informs the semiconductor device 20_S, by outputting EA=0, that the semiconductor device 20_R cannot receive new data. By receiving SA=0, the semiconductor device 20_S learns that the semiconductor device 20_R is in a state unable to receive new data.

At the same time, by receiving SA=0, the semiconductor device 20_S learns that the semiconductor device 20_R is in a state capable of receiving a spacer. When receiving the spacer, the semiconductor device 20_R outputs EA=1 and informs the semiconductor device 20_S that the semiconductor device 20_R is in a state capable of receiving new data. The semiconductor device 20_S receives SA=1 and learns that the semiconductor device 20_R is in a state capable of receiving new data. Then, the semiconductor device 20_S sends new data to the semiconductor device 20_R.

The summary of the above description is as follows:

(1) when SA=1, the semiconductor device 20 is in a state capable of sending data to the next-stage semiconductor device;

(2) when SA=0, the semiconductor device 20 is in a state unable to send data to the next-stage semiconductor device;

(3) when EA=1, the semiconductor device 20 is in a state capable of receiving data from the previous-stage semiconductor device; and (4) when EA=0, the semiconductor device 20 is in a state unable to receive data from the previous-stage semiconductor device.

<<Programmable Logic Element>>

Figure 6:
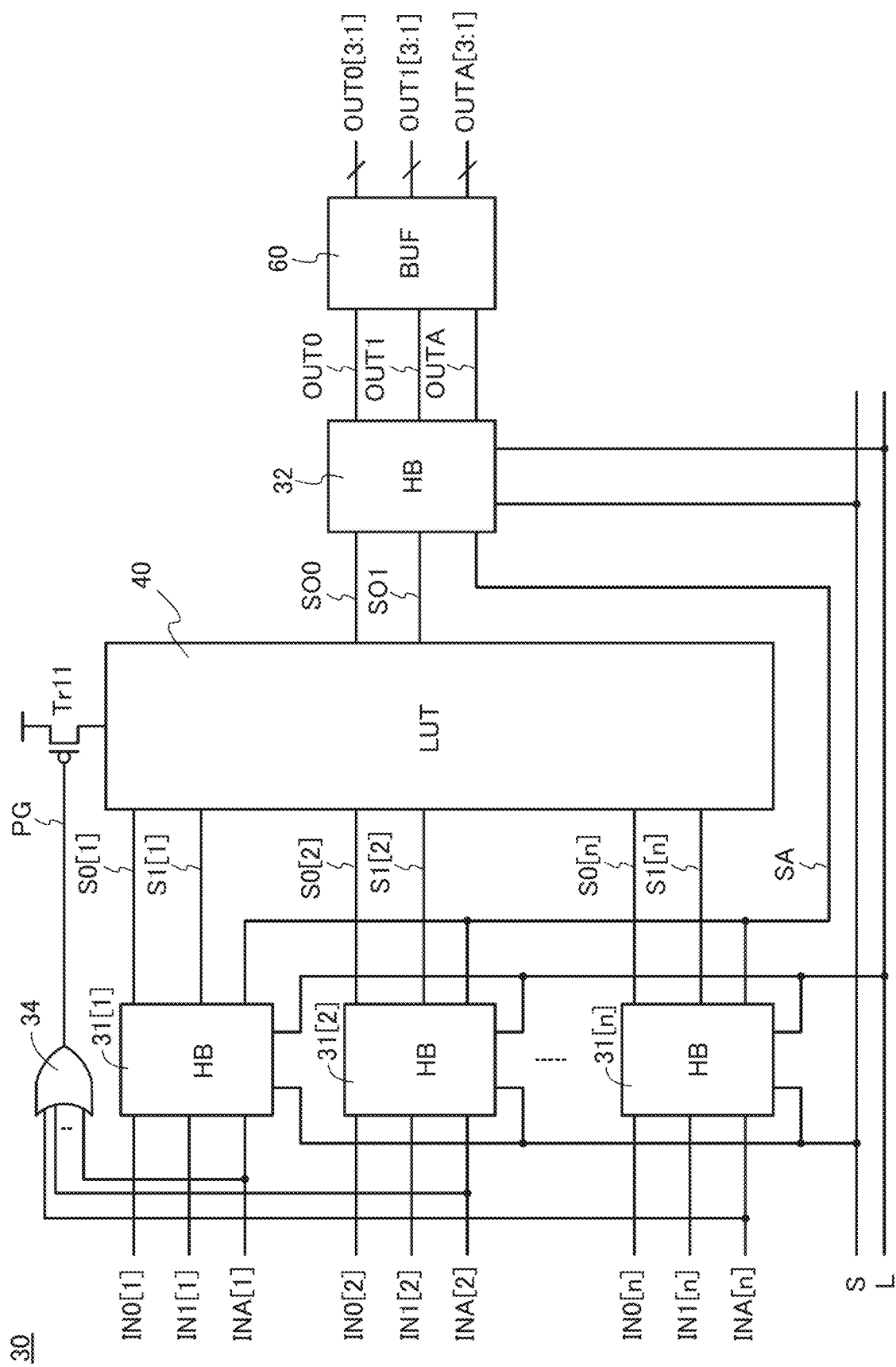
FIG. 6 is a circuit diagram illustrating a configuration example of a programmable logic element.

FIG. 6 shows an example where a programmable logic element (PLE) is formed with the above-described semiconductor device 20. A PLE 30 shown in FIG. 6 includes HBs 31[1] to 31[n] (n is an integer larger than or equal to 1), a HB 32, a buffer (BUF) 60, a lookup table (LUT) 40, a transistor Tr11, and an OR circuit 34.

The PLE 30 is an n-input 3-output PLE. The number of inputs and the number of outputs are not limited to those in this example, and any numbers can be used.

The transistor Tr11 is a power switch and has a function of controlling conduction and non-conduction between the LUT 40 and a power source. When the transistor Tr11 is turned on, the LUT 40 receives the power supply voltage and operates.

The HB 31[i] (i is an integer greater than or equal to 1 and less than or equal to n) is the same circuit as the semiconductor device 20 shown in FIG. 3A. Signals IN0[i], IN1[i], INA[i], S0[i], S1[i], SA, S, and L in FIG. 6 correspond to the signals E0, E1, EA, S0, S1, SA, S, and L in FIG. 3A, respectively.

The HB 32 is also the same circuit as the semiconductor device 20 shown in FIG. 3A. Signals SO0, SO1, SA, OUT0, OUT1, OUTA, S, and L in FIG. 6 correspond to the signals E0, E1, EA, S0, S1, SA, S, and L in FIG. 3A, respectively.

When (IN0[$i$], IN1[$i$]) is changed from a spacer to data in the PLE 30, (S0[$i$], S1[$i$]) is changed from a spacer to data and the signal INA[i] is changed from "1" to "0".

When all the output signals from the HBs 31[1] to 31[$n$] are changed from spacers to data and all the signals INA[1] to INA[n] are changed to "0", an output signal (a signal PG) from the OR circuit 34 becomes "0" and the transistor Tr11 is turned on. Thus, the LUT 40 operates.

<<Lookup Table>>

Figure 7:
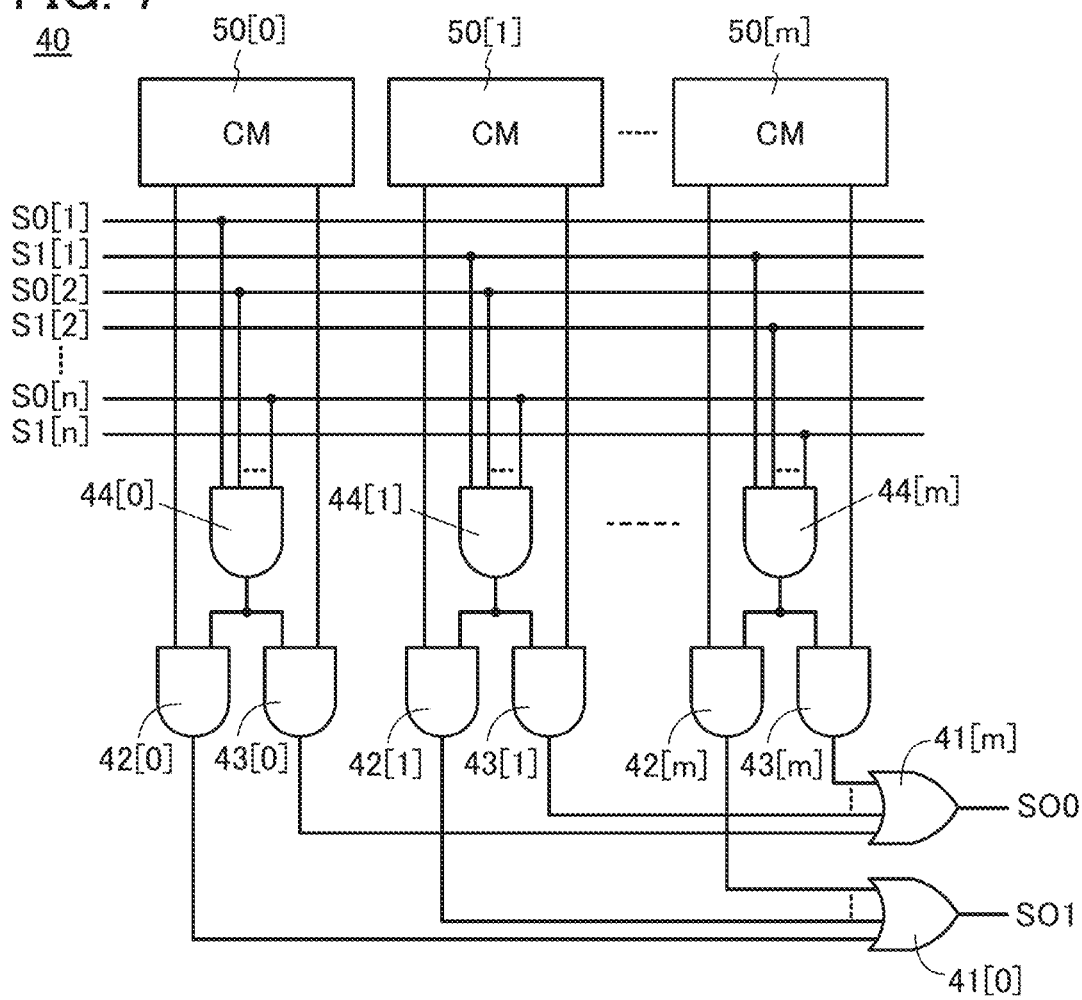
FIG. 7 is a circuit diagram illustrating a configuration example of a lookup table.

FIG. 7 is a circuit diagram illustrating a configuration example of the LUT 40. The LUT 40 includes configuration memories (CMs) 50[0] to 50[$m$] (m is an integer greater than or equal to 0 and less than or equal to $2^n-1$), OR circuits 41[0] to 41[$m$], AND circuits 42[0] to 42[$m$], AND circuits 43[0] to 43[$m$], and AND circuits 44[0] to 44[$m$].

The LUT 40 selects one of the CMs 50[0] to 50[$m$] in accordance with the values of (S0[1], S1[1]) to (S0[$n$], S1[$n$]) and outputs (SO0, SO1). For example, when data ("1", "0", ..., "0") is input to the LUT 40, (S0[1], S1[1]), (S0[2], S1[2]), ..., (S0[$n$], S1[$n$]) are (0, 1), (1, 0), ..., (1,0), respectively, and thus the CM 50[1] is selected.

<<Configuration Memory>>

Figure 8:
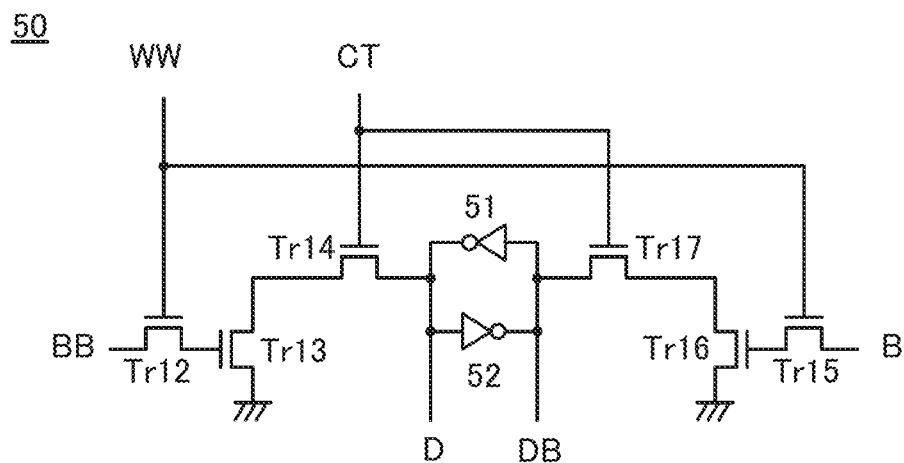
FIG. 8 is a circuit diagram illustrating a configuration example of a configuration memory.

FIG. 8 is a circuit diagram illustrating a configuration example of the CM 50. The CM 50 includes transistors Tr12 to Tr17, an inverter 51, and an inverter 52. The transistors Tr12 and Tr15 are preferably the above-described OS transistors. Signals WW, CT, B, and BB are input signals to the CM 50, and signals D and DB are output signals from the CM 50.

To write configuration data "0" to the CM 50, the signal WW is set at H level to turn on the transistors Tr12 and Tr15, and the signals B and BB are set to "0" and "1", respectively.

After that, the signal WW is set at L level to turn off the transistors Tr12 and Tr15; as a result, a gate of the transistor Tr16 holds "0" and a gate of the transistor Tr13 holds "1".

Then, the signal CT is set at H level to turn on the transistors Tr14 and Tr17, and D=0 and DB=1 can be obtained. That is, the configuration data "0" is read out from the CM 50.

To write configuration data "1" to the CM 50, B and BB are set to "1" and "0", respectively, in the above operation.

A multi-context PLD can be formed with the use of a plurality of groups of the transistors Tr12 to Tr17.

<<Buffer>>

Figure 9:
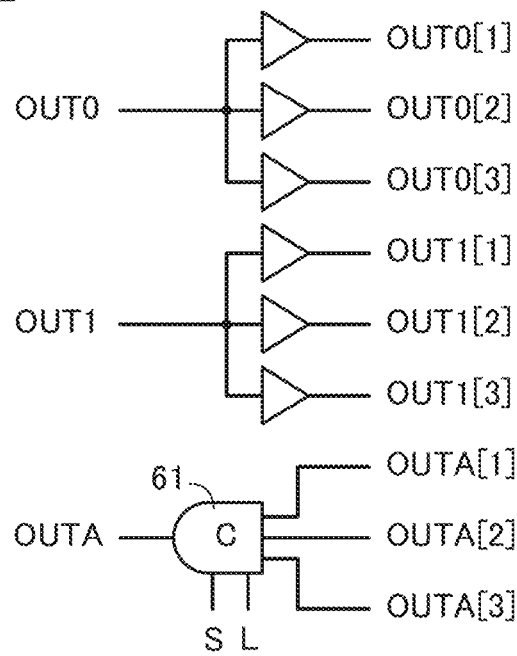
FIG. 9 is a circuit diagram illustrating a configuration example of a buffer circuit.

FIG. 9 is a circuit diagram illustrating a configuration example of the BUF 60. The BUF 60 has a function of dividing the signal OUT0 into signals OUT0[1] to OUT0[3], and dividing the signal OUT1 into signals OUT1[1] to OUT1[3]. The BUF 60 includes a circuit 61, and has a function of combining signals OUTA[1] to OUTA[3] into the signal OUTA. The circuit 61 is the same circuit as the semiconductor device 13 shown in FIG. 2C.

When all the signals OUTA[1] to OUTA[3] are "1", the BUF 60 sets OUTA "1". When all the signals OUTA[1] to OUTA[3] are "0", the BUF 60 sets OUTA "0".

Here, FIG. 6 is further described. When the LUT 40 operates to change (SO0, SO1) from a spacer to data, the signal SA is changed from "1" to "0". This means that the HB 32 receives the output from the LUT 40. Since the signal SA is "0" after that, the HB 31[$i$] cannot update the output signal until it receives a spacer, and the output signal from the LUT 40 does not change. That is, the HB 32 can stably receive the output signal from the LUT 40.

When the input signal to the HB 31[$i$] is changed to the spacer, INA[i] is changed from "0" to "1." Thus, PG becomes "1" and the transistor Tr11 is turned off. As a result, the operation of the LUT 40 stops. That is, the PLE 30 can perform local power gating.

<<Timing Chart>>

Figure 10:
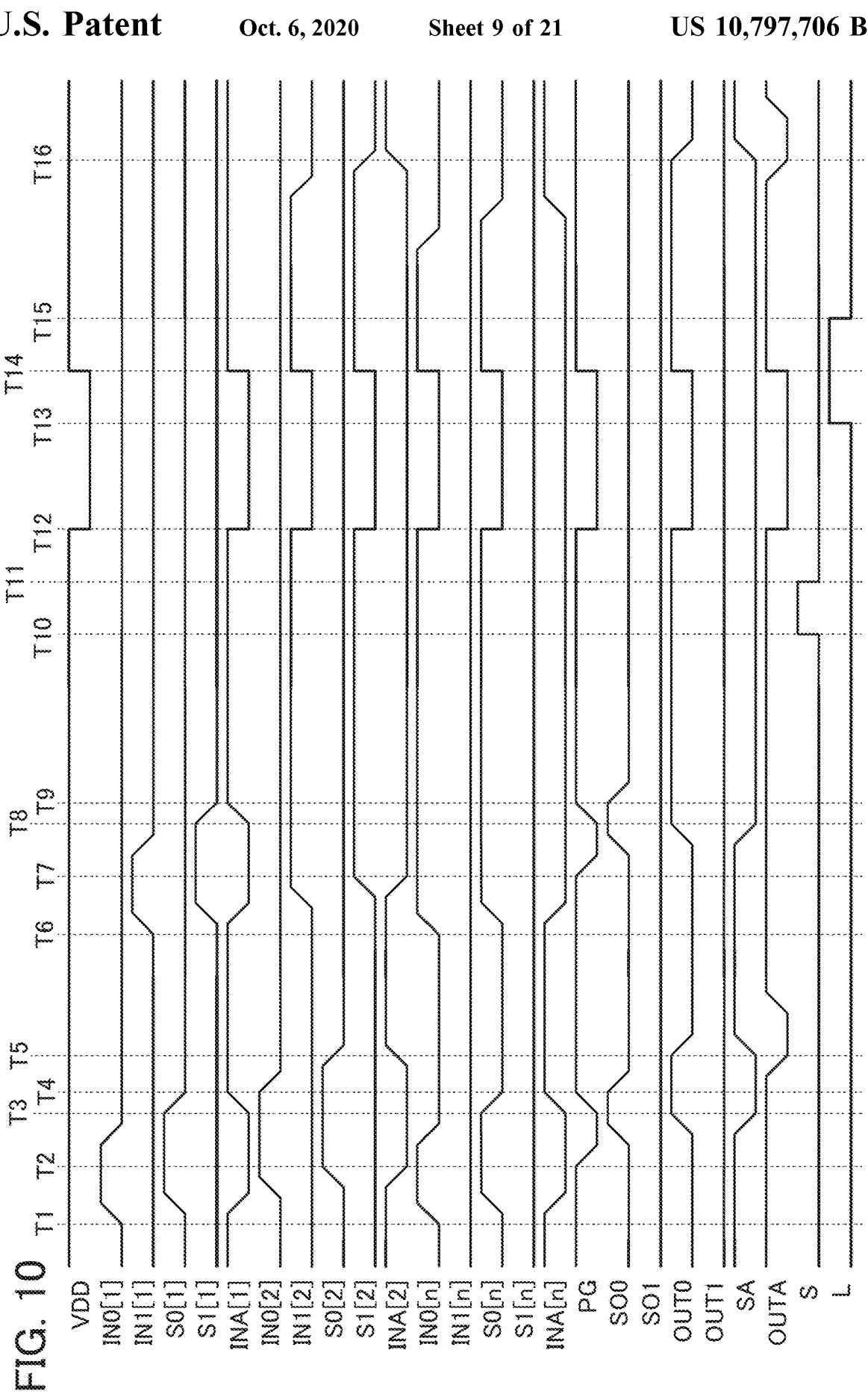
FIG. 10 is a timing chart illustrating an operation example of a programmable logic element.

FIG. 10 is a timing chart illustrating an operation of the PLE 30. FIG. 10 shows potential changes of the signals of the PLE 30. Times T1 to T16 are given in FIG. 10 to show operation timings.

In the initial state, spacers are given to the input and output signals of the PLE 30. The PLE 30 is capable of receiving an input signal and sending an output signal. The LUT 40 performs power gating.

An operation from the time T1 to the time T5 corresponds to an operation in the case where data ("0", "0", ..., "0") is input to the PLE 30. An operation from the time T6 to the time T16 corresponds to an operation in the case where data ("1", "1", ..., "0") is input to the PLE 30.

An operation from the time T10 to the time T15 corresponds to an operation in the case where global power gating is performed.

At the time T1, (IN0[1], IN1[1]) is changed from (0, 0) to (1, 0). After a certain delay time, (S0[1], S1[1]) is changed from (0, 0) to (1, 0). In addition, INA[1] is changed from "1" to "0".

Similarly, (IN0[2], IN1[2]) is changed from (0, 0) to (1, 0). After a certain delay time, (S0[2], S1[2]) is changed from (0, 0) to (1, 0) and INA[2] is changed from "1" to "0".

Similarly, (IN0[$n$], IN1[$n$]) is changed from (0, 0) to (1, 0). After a certain delay time, (S0[$n$], S1[$n$]) is changed from (0, 0) to (1, 0) and INA[n] is changed from "1" to "0".

The change of (IN0[2], IN1[2]) is the slowest of the changes of (IN0[1], IN1[1]) to (IN0[$n$], IN1[$n$]). Thus, the change of INA[2] is the slowest of the changes of INA[1] to INA[n].

At the time T2, INA[2] becomes "0" and INA[1] to INA[n] are all "0", whereby PG becomes "0". The transistor Tr11 is turned on and the LUT 40 starts to operate.

The LUT 40 selects one of the CMs 50[0] to 50[$m$] in accordance with the values of (S0[1], S1[1]) to (S0[$n$], S1[$n$]) and outputs (SO0, SO1). Here, (SO0, SO1) is (1, 0).

Then, (OUT0, OUT1) is changed from (0, 0) to (1, 0) and the signal SA is changed from "1" to "0".

The HB 31[1] to which a spacer is input before the time T3 outputs a spacer in response to SA=0. That is, (S0[1], S1[1]) is changed from (1, 0) to (0, 0). At the time T3, the signal INA[1] is changed from "0" to "1".

Similarly, the HB 31[$n$] to which a spacer is input before the time T3 outputs a spacer in response to SA=0. That is, (S0[$n$], S1[$n$]) is changed from (1, 0) to (0, 0). At the time T3, the signal INA[n] is changed from "0" to "1".

The HB 31[2] to which the spacer is not input at the time T3 outputs a spacer after the time T3 in response to input of a spacer. At that time, (S0[2], S1 [2]) is changed from (1, 0) to (0, 0).

At the time T4, INA[1] and INA[n] become "1", so that PG is set to "1". The transistor Tr11 is turned off and power supply to the LUT 40 stops; accordingly, the LUT 40 starts to perform local power gating. Here, (SO0, SO1) is changed from (1, 0) to (0, 0).

At the time T5, OUTA becomes "0" and (OUT0, OUT1) is changed from (1, 0) to (0, 0). In addition, SA is changed from "0" to "1".

An operation from the time T6 to the time T9 can be explained in a manner similar to that for the operation from the time T1 to the time T5 by replacing the data input to the PLE 30 with ("1", "1", . . . , "0"). At the time T9, (IN0[1], IN1[1]) is a spacer, (IN0[2], IN1[2]) is data "1", and (IN0[n], IN1[n]) is data "0".

The states of the signals immediately before the time T10 are as follows: INA[1]=1, INA[2]=0, INA[n]=0, SA=0, and OUTA=1; the HB 31[1] can receive data but cannot send data; the HB 31[2] cannot receive nor send data; the HB 31[n] cannot receive nor send data; and the HB 32 cannot receive data but can send data.

The signal S is set to "1" at the time T10, so that the HB 31[1], the HB 31[2], the HB 31[n], and the HB 32 store data held in their respective inverter loops (each corresponding to the latch circuit 11 in FIG. 1A) in the corresponding nonvolatile registers (each corresponding to the memory circuit 12 in FIG. 1A).

At the time T12, supply of the power supply voltage to the PLE 30 is stopped. At this time, the signals become "0"; however, data stored in the HB 31[1], the HB 31[2], the HB 31[n], and the HB 32 are not lost.

At the time T13, L is set to "1". At the time T14, supply of the power supply voltage to the PLE 30 is restarted. Here, while the data in the nonvolatile registers of the HB 31[1], the HB 31[2], the HB 31[n], and the HB 32 are stored in the corresponding inverter loops, the PLE 30 is supplied with the power supply voltage.

The states of the signals immediately after the time T15 are as follows: INA[1]=1, INA[2]=0, INA[n]=0, SA=0, and OUTA=1; the HB 31[1] can receive data but cannot send data; the HB 31[2] cannot receive nor send data; the HB 31[n] cannot receive nor send data; and the HB 32 cannot receive data but can send data. That is, the state at the time T10 is maintained.

The state of the PLE 30 does not change through the global power gating, and thus processing before the power gating can be continued.

An operation at and after the time T16 can be explained in a manner similar to that for the operation at and after the time T5.

The PLE 30 can operate as an asynchronous circuit by repeating similar operations.

<<Programmable Logic Device>>

Figure 11:
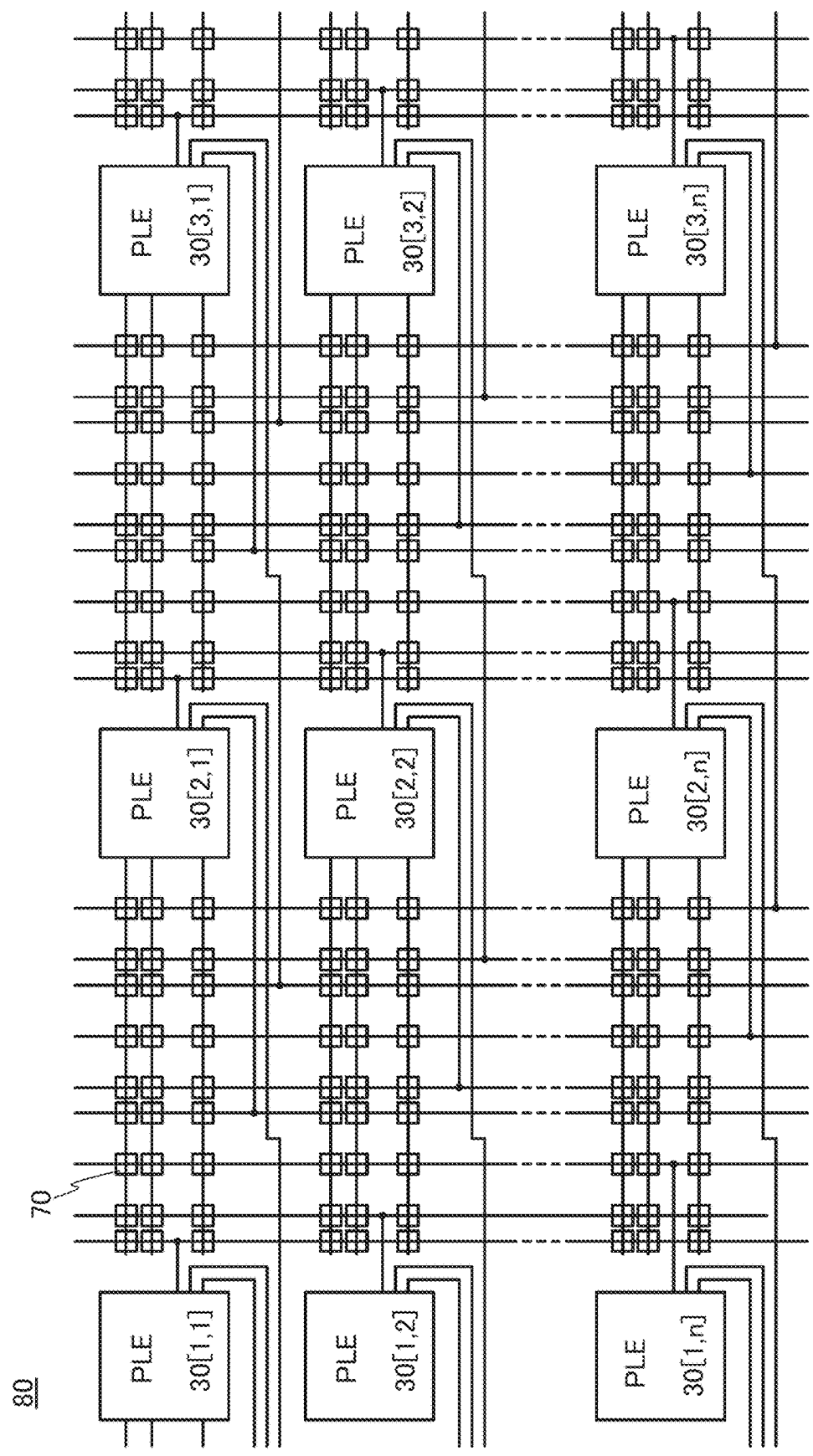
FIG. 11 is a circuit diagram illustrating a configuration example of a programmable logic device.

FIG. 11 is a circuit diagram illustrating a configuration example of a programmable logic device (PLD) 80. The PLD 80 includes a plurality of PLEs 30 and a plurality of programmable switch elements (PSEs) 70. In the PLD 80, the plurality of PLEs 30 are arranged in an array, and electrical connections between the PLEs 30 are made by the PSEs 70. FIG. 11 shows the PLEs 30[1, 1] to 30[3, n] arranged in three rows and n columns, as a representative example.

<<Programmable Switch Element>>

Figure 12:
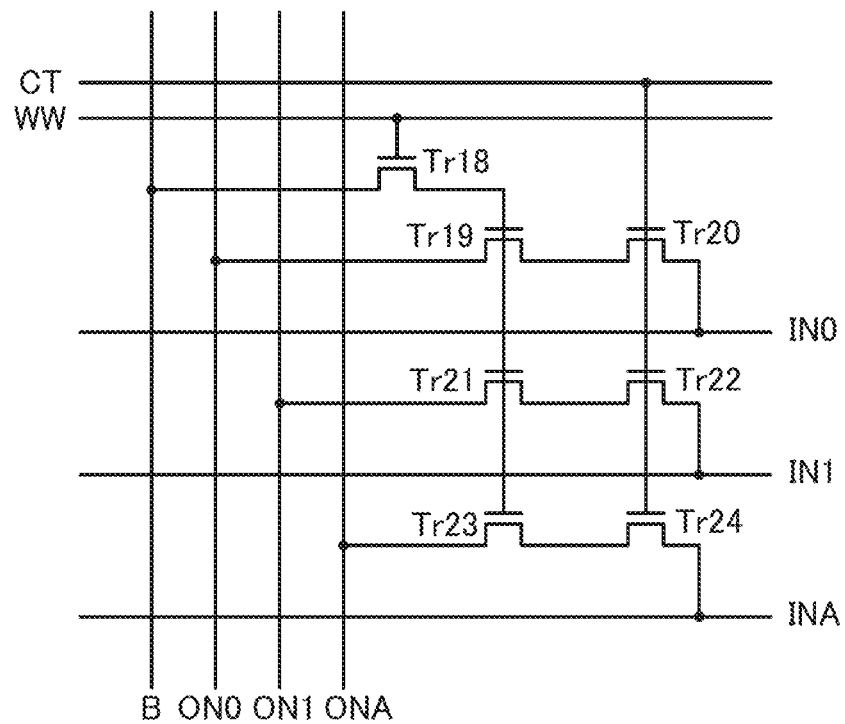
FIG. 12 is a circuit diagram illustrating a configuration example of a programmable switch element.

FIG. 12 is a circuit diagram illustrating a configuration example of the PSE 70. The PSE 70 includes transistors Tr18 to Tr24. The transistor Tr18 is preferably the above-described OS transistor.

To write configuration data "1" to the PSE 70 (to turn on the PSE 70), the signal WW is set at H level to turn on the transistor Tr18 and the signal B is set to "1". The signal WW is set at L level after that to turn off the transistor Tr18, so that gates of the transistors Tr19, Tr21, and Tr23 each hold "1".

To write configuration data "0" to the PSE 70 (to turn off the PSE 70), the signal WW is set at H level to turn on the transistor Tr18, and the signal B is set to "0". The signal WW is set at L level after that to turn off the transistor Tr18, so that the gates of the transistors Tr19, Tr21, and Tr23 each hold "0".

When the signal CT is set at H level to turn on the transistors Tr20, Tr22, and Tr24, connections between output signal lines for the signals ON0, ON1, and ONA in a first PLE 30 and input signal lines for the signals IN0, IN1, and INA in a second PLE 30 can individually be controlled.

An asynchronous circuit requires a plurality of signal lines for signal reception and transmission, and thus has an increased number of switches for signal line routing. However, with the configuration in FIG. 12, configuration data can be written and held in the plurality of switches only with the transistor Tr18, and thus the number of transistors included in the PSE 70 can be reduced.

A multi-context programmable logic device can be formed with the use of a plurality of groups of the transistors Tr18 to Tr24.

With the use of the configuration shown in this embodiment, a programmable logic device including an asynchronous circuit can be provided. In addition, a programmable logic device with low power consumption can be provided.

Embodiment 2

Figure 13:
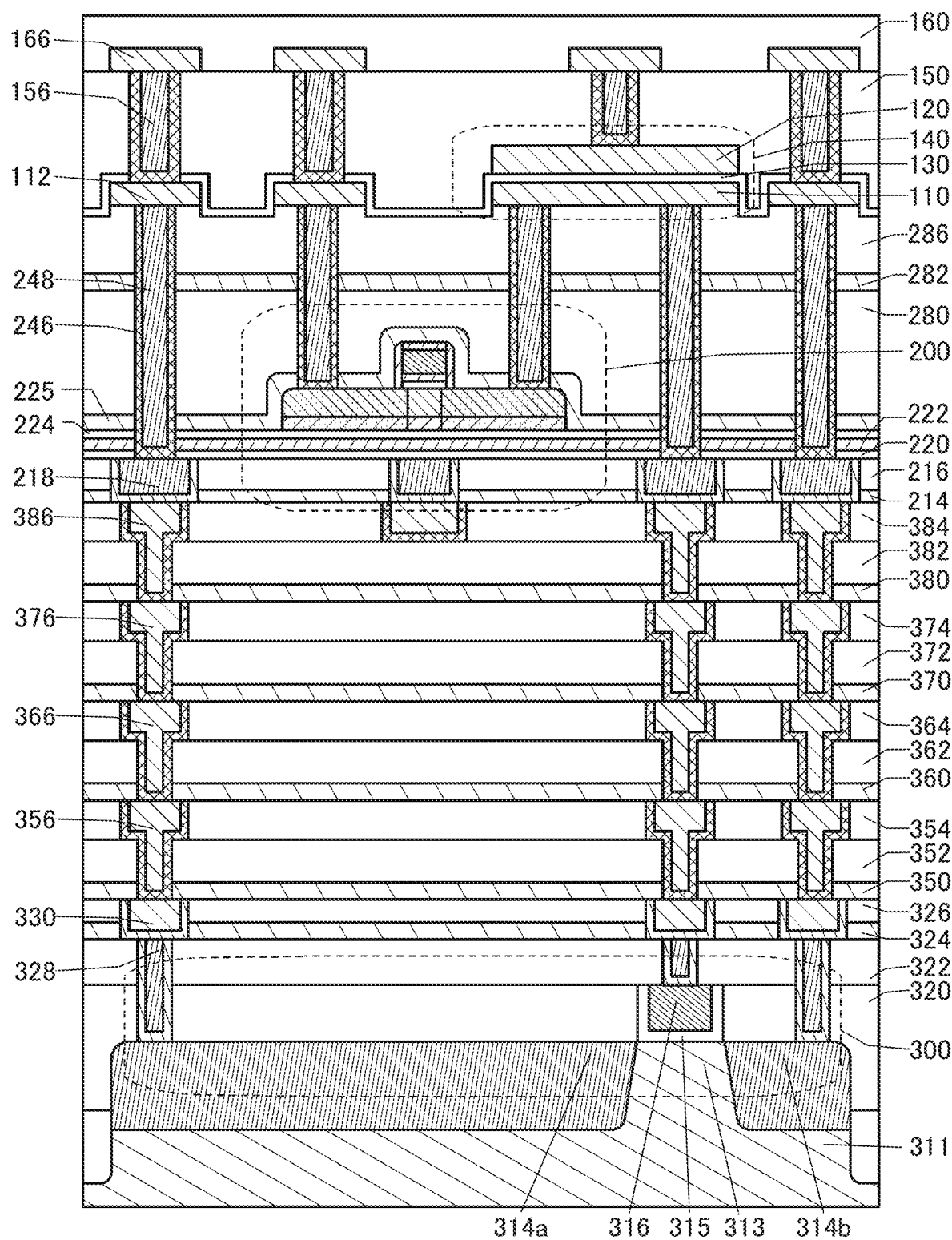
FIG. 13 is a cross-sectional view illustrating a structure example of a semiconductor device.
Figure 14:
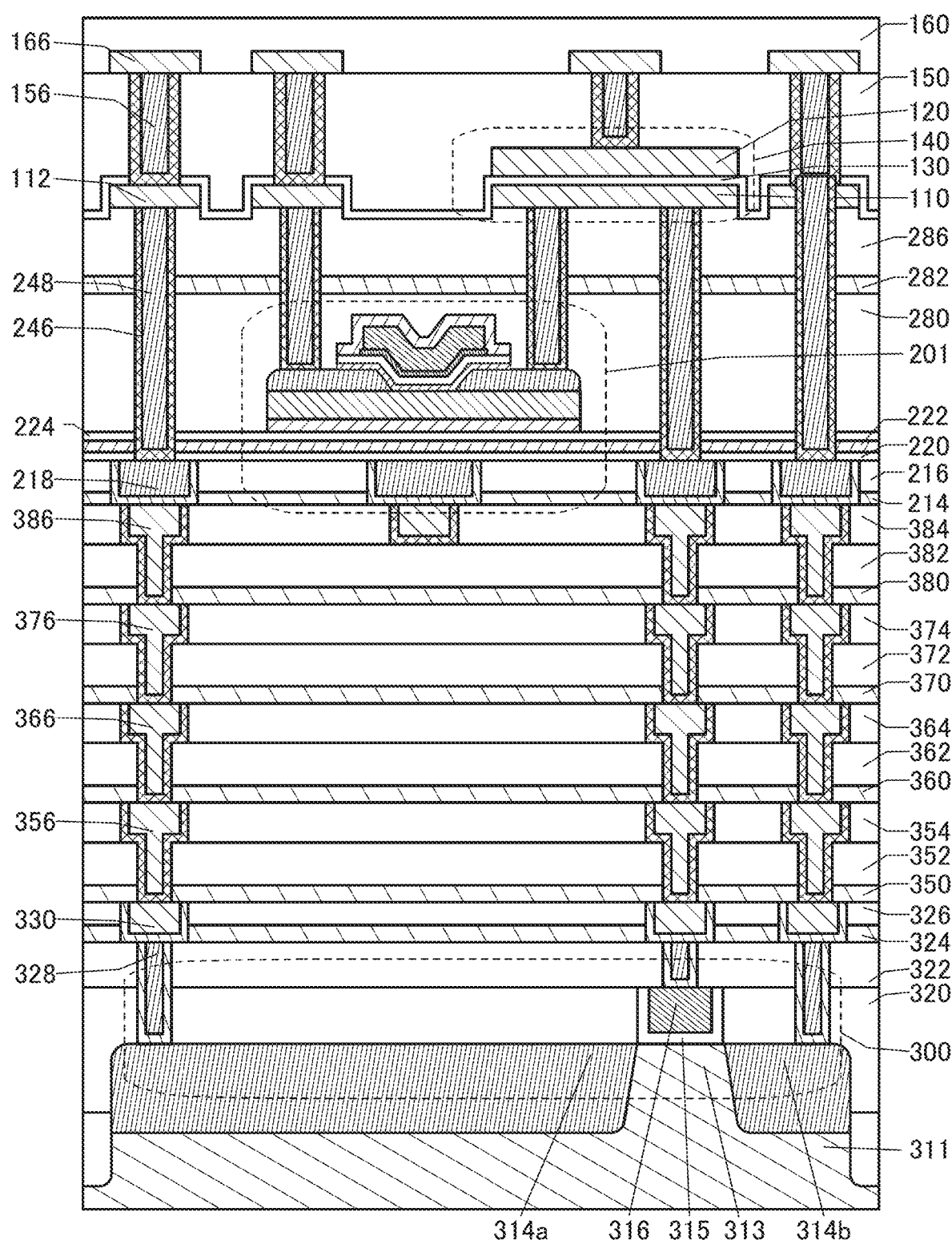
FIG. 14 is a cross-sectional view illustrating a structure example of a semiconductor device.

This embodiment will describe embodiments of a semiconductor device that can be used for the PLD 80 described in the above embodiment, with reference to FIG. 13 and FIG. 14.

<Cross-Sectional Structure of Semiconductor Device 100>

FIG. 13 is a cross-sectional view illustrating an example of a semiconductor device 100. The semiconductor device 100 includes a transistor 300, a transistor 200, and a capacitor 140. The transistor 200 is provided over the transistor 300 and the capacitor 140 is provided over the transistor 300 and the transistor 200.

The transistor 200 is an OS transistor including an oxide semiconductor in its channel formation region. Because an OS transistor can be formed with high yield even when it is miniaturized, the transistor 200 can be miniaturized. The use of such a transistor in a semiconductor device allows miniaturization or high integration of the semiconductor device. Since the off-state current of the OS transistor is low, using the OS transistor in the semiconductor device enables stored data to be retained for a long time. In other words, such a semiconductor device does not require refresh operation or has an extremely low frequency of refresh operation, and thus uses sufficiently reduced power.

The transistor 300 is provided over a substrate 311 and includes a conductor 316, an insulator 315, a semiconductor region 313 that is part of the substrate 311, and low-resistance regions 314a and 314b functioning as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material used for a conductor determines the work function, whereby a threshold voltage can be adjusted. Specifically, it is preferable to use titanium nitride, tantalum nitride, or the like as the conductor. Furthermore, in order to ensure the conductivity and embeddability of the conductor, it is preferable to use stacked layers of metal materials such as tungsten and aluminum as the conductor. In particular, tungsten is preferable in terms of heat resistance.

In the transistor 300 illustrated in FIG. 13, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 300 illustrated in FIG. 13 is only an example and its structure is not limited to that illustrated in FIG. 13; any transistor appropriate for the circuit configuration or driving method can be used.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from diffusing from the substrate 311, the transistor 300, or the like into a region where the transistor 200 is formed.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 326 is preferably 0.7 times or less that of the insulator 324, more preferably 0.6 times or less that of the insulator 324. In the case where a material with a low dielectric constant is used as an interlayer film, the parasitic capacitance between wirings can be reduced.

A conductor 328, a conductor 330, and the like are provided in the insulator 320, the insulator 322, the insulator 324, and the insulator 326. Note that the conductor 328 and the conductor 330 function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of the conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 13, an insulator 350, an insulator 352, an insulator 354, an insulator 360, an insulator 362, an insulator 364, an insulator 370, an insulator 372, an insulator 374, an insulator 380, an insulator 382, and an insulator 384 are stacked sequentially. Furthermore, a conductor 356, a conductor 366, a conductor 376, and a conductor 386 are formed in these insulators. These conductors function as plugs or wirings. Note that these conductors can be formed using a material similar to that used for forming the conductor 328 or the conductor 330.

Note that the insulator 350, the insulator 360, the insulator 370, and the insulator 380 are preferably formed using an insulator having a barrier property against hydrogen, like the insulator 324. Furthermore, the conductor 356, the conductor 366, the conductor 376, and the conductor 386 preferably include a conductor having a barrier property against hydrogen. For example, as to the insulator 350 and the conductor 356, formation of the conductor 356 in an opening of the insulator 350 can prevent the diffusion of hydrogen from the transistor 300 to the transistor 200. The same can apply to the other insulators and conductors.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is maintained.

An insulator 214 and an insulator 216 are stacked over the insulator 384. A material having a barrier property against oxygen or hydrogen is preferably used for any of the insulators 214 and 216.

The insulator 214 is preferably formed using, for example, a film having a barrier property that prevents hydrogen and impurities from diffusing from the substrate 311, a region where the transistor 300 is formed, or the like to a region where the transistor 200 is formed. Therefore, the insulator 214 can be formed using a material similar to that used for forming the insulator 324.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a barrier property against hydrogen, for example, a metal oxide such as aluminum oxide, hafnium oxide, or tantalum oxide is preferably used for the insulator 214.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Thus, aluminum oxide is suitably used as a protective film for the transistor 200.

For example, the insulator 216 can be formed using a material similar to that used for forming the insulator 320. In the case a material with a relatively low dielectric constant is used for an interlayer film, the parasitic capacitance between wirings can be reduced. For example, a silicon oxide film, a silicon oxynitride film, or the like can be used as the insulator 216.

A conductor 218, a conductor (e.g., an electrode serving as a back gate) included in the transistor 200, and the like are provided in the insulators 214 and 216. The conductor 218 can be formed using a material similar to that used for forming the conductor 328 and the conductor 330.

The conductor 218 is preferably a conductor having a barrier property against oxygen, hydrogen, and water. In such a structure, the transistor 300 and the transistor 200 can be completely separated by a layer having a barrier property with respect to oxygen, hydrogen, and water, so that diffusion of hydrogen from the transistor 300 into the transistor 200 can be prevented.

The transistor 200 is provided over the insulator 216. Note that an OS transistor may be used as the transistor 200. The details of the transistor 200 will be described in Embodiment 3.

An insulator 280 is provided over the transistor 200. In the insulator 280, an excess-oxygen region is preferably formed. In particular, in the case of using an oxide semiconductor in the transistor 200, providing an insulator including an excess-oxygen region as an interlayer film or the like in the vicinity of the transistor 200 reduces oxygen vacancies in the oxide semiconductor included in the transistor 200, whereby the reliability can be improved. The insulator 280 covering the transistor 200 may function as a planarization film that covers a roughness thereunder. Note that the insulator 280 is provided in contact with an insulator 225 formed over the transistor 200.

As the insulator including the excess-oxygen region, specifically, an oxide material that releases some oxygen by heating is preferably used. Oxide that releases oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen more than nitrogen, and "silicon nitride oxide" refers to a material that contains nitrogen more than oxygen.

An insulator 282 may be provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example. For example, when the insulator 282 is formed by a sputtering method with the use of plasma including oxygen, oxygen can be added to the insulator 280 serving as a base layer of the oxide.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Thus, aluminum oxide is suitably used as a protective film for the transistor 200.

An insulator 286 is provided over the insulator 282. The insulator 286 can be formed using a material similar to that used for forming the insulator 320. In the case where a material with a relatively low dielectric constant is used for an interlayer film, the parasitic capacitance between wirings can be reduced. For example, a silicon oxide film, a silicon oxynitride film, or the like can be used as the insulator 286.

Conductors 246 and 248 and the like are provided in insulators 220, 222, 224, 250, 280, 282, and 286.

The conductors 246 and 248 can be formed using a material similar to those used for forming the conductors 328 and 330.

The capacitor 140 is provided above the transistor 200. The capacitor 140 includes a conductor 110, a conductor 120, and an insulator 130.

A conductor 112 may be provided over the conductors 246 and 248. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like.

Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

The conductor 112 and the conductor 110 each have a single-layer structure in FIG. 13; however, one embodiment of the present invention is not limited thereto, and a stacked-layer structure of two or more layers may be used. For example, a conductor which is highly adhesive to a conductor having a barrier property and a conductor with high conductivity may be positioned between the conductor having a barrier property and the conductor with high conductivity.

As a dielectric of the capacitor 140, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 140 having the structure, the dielectric strength can be increased and the electrostatic breakdown of the capacitor 140 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may function as a planarization film that covers a roughness thereunder.

The above is the description of the structure example. With the use of the structure, a change in electrical characteristics can be suppressed and reliability can be improved in a semiconductor device including an OS transistor. The power consumption of a semiconductor device including an OS transistor can be reduced. Miniaturization or high integration of a semiconductor device including an OS transistor can be achieved. A miniaturized or highly integrated semiconductor device can be provided with a high yield.

Modification Example 1 of Semiconductor Device 100

FIG. 14 illustrates a modification example of this embodiment.

FIG. 14 is a schematic cross-sectional view in which the transistor 200 illustrated in FIG. 13 is replaced with a transistor 201. Like the transistor 200, the transistor 201 is an OS transistor. Note that the details of the transistor 201 will be described in Embodiment 3.

For the details of the other components in FIG. 14, the description of FIG. 13 can be referred to.

Embodiment 3

In this embodiment, the details of the transistor 200 and the transistor 201 in Embodiment 2 are described with reference to FIGS. 15A to 15C, FIGS. 16A and 16B, FIGS. 17A to 17C, and FIGS. 18A to 18C.

<<Transistor 200>>

First, the details of the transistor 200 illustrated in FIG. 13 will be described.

Figure 15A:
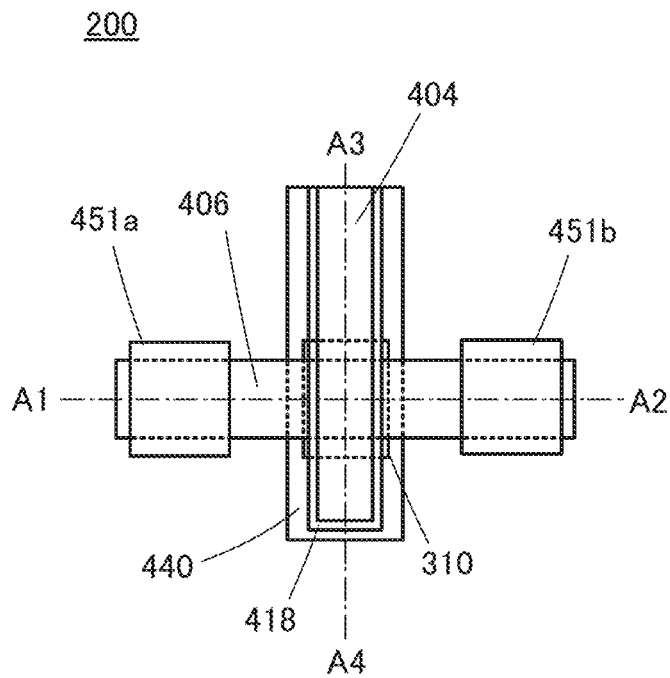
FIG. 15A is a top view illustrating a structure example of a transistor.
Figure 15C:
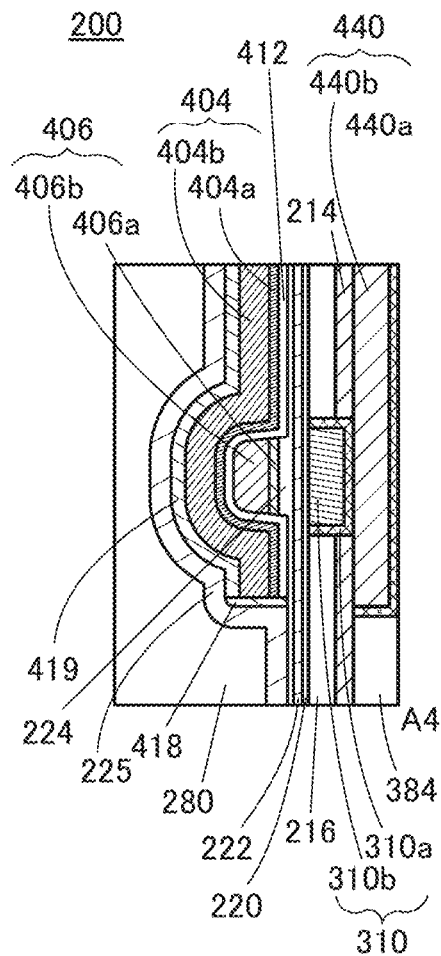
FIGS. 15B and 15C are cross-sectional views illustrating the structure example of the transistor.
Figure 15B:
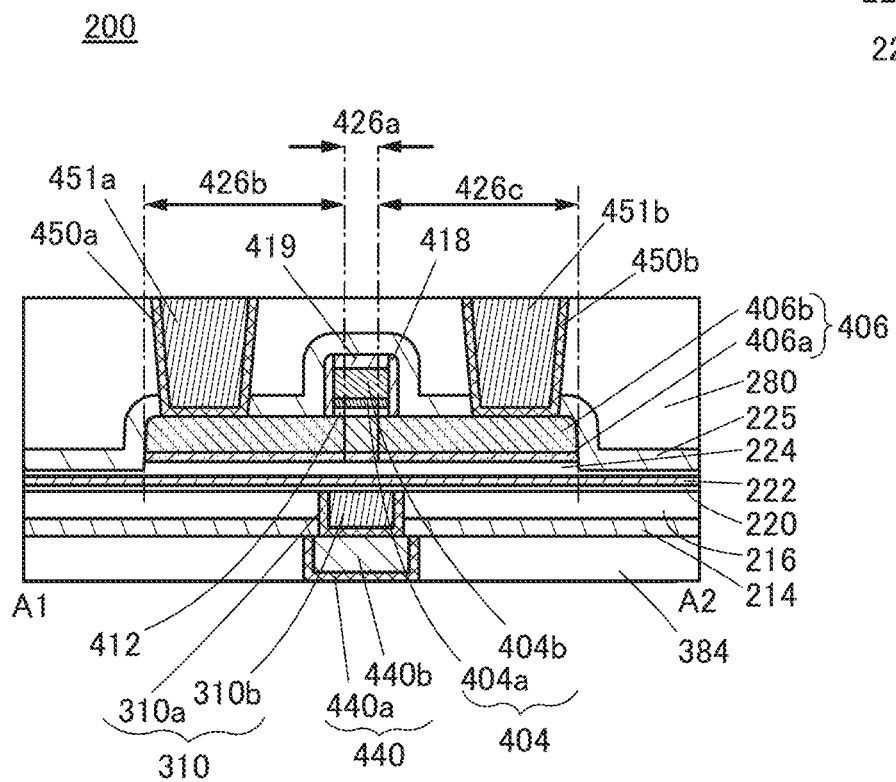

FIG. 15A is a plan view of a semiconductor device including the transistor 200. FIG. 15B is a cross-sectional view taken along dashed-dotted line A1-A2 in FIG. 15A, which corresponds to a cross-sectional view in the channel length direction of the transistor 200. FIG. 15C is a cross-sectional view taken along dashed-dotted line A3-A4 in FIG. 15A, which corresponds to a cross-sectional view in the channel width direction of the transistor 200. Note that in the top view of FIG. 15A, some components are not illustrated for simplification of the drawings.

As illustrated in FIGS. 15A to 15C, the transistor 200 includes an insulator 224 over a substrate (not illustrated), a metal oxide 406a over the insulator 224, a metal oxide 406b in contact with at least part of the top surface of the metal oxide 406a, an insulator 412 over the metal oxide 406b, a conductor 404a over the insulator 412, a conductor 404b over the conductor 404a, an insulator 419 over the conductor 404b, an insulator 418 in contact with side surfaces of the insulator 412, the conductor 404a, the conductor 404b, and the insulator 419, and the insulator 225 in contact with the top surface of the metal oxide 406b and a side surface of the insulator 418. As illustrated in FIG. 15B, it is preferable that the top surface of the insulator 418 be substantially aligned with the top surface of the insulator 419. Furthermore, the insulator 225 is preferably provided to cover the insulator 419, the conductor 404, the insulator 418, and the metal oxide 406.

In the following description, the metal oxide 406a and the metal oxide 406b are collectively referred to as the metal oxide 406 in some cases. Although the metal oxide 406a and the metal oxide 406b are stacked in the transistor 200, the present invention is not limited to this structure. For example, only the metal oxide 406b may be provided. Furthermore, the conductor 404a and the conductor 404b may be collectively referred to as a conductor 404. Although the conductor 404a and the conductor 404b are stacked in the transistor 200, the present invention is not limited to this structure. For example, a structure in which only the conductor 404b is provided may be employed.

A conductor 440 includes a conductor 440a that is in contact with an inner wall of an opening of the insulator 384 and a conductor 440b that is positioned inside the conductor 440a. Here, the top surfaces of the conductors 440a and 440b can be at substantially the same level as the top surface of the insulator 384. Although the conductor 440a and the conductor 440b are stacked in the transistor 200, the present invention is not limited to this structure. For example, only the conductor 440b may be provided.

A conductor 310 includes a conductor 310a that is in contact with an inner wall of an opening of the insulators 214 and 216, and a conductor 310b that is positioned inside the conductor 310a. Thus, a structure in which the conductor 310a is in contact with the conductor 440b is preferable. The top surfaces of the conductors 310a and 310b can be at substantially the same level as the top surface of the insulator 216. Although the conductor 310a and the conductor 310b are stacked in the transistor 200, the present invention is not limited to this structure. For example, a structure in which only the conductor 310b is provided may be employed.

The conductor 404 can serve as a top gate, and the conductor 310 can serve as a back gate. The potential of the back gate can be the same as the potential of the top gate, the ground potential, or an arbitrary potential. By changing the potential of the back gate independently of the potential of the top gate, the threshold voltage of the transistor can be changed.

The conductor 440 extends in the channel width direction in a similar manner to the conductor 404, and the conductor 440 serves as a wiring through which a potential is applied to the back gate. When the conductor 310 is stacked over the conductor 440, the insulators 214 and 216 and the like are positioned between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. The increase in the withstand voltage between the conductor 440 and the conductor 404 can improve the reliability of the transistor 200. Therefore, the thicknesses of the insulator 214 and the insulator 216 are preferably large. Note that the extending direction of the conductor 440 is not limited to this example; for example, the conductor 440 may extend in the channel length direction of the transistor 200.

Here, it is preferable to use conductive materials that have a function of inhibiting the passage of impurities such as water or hydrogen or hardly transmit such impurities for the conductor 310a and the conductor 440a. For example, tantalum, tantalum nitride, ruthenium, ruthenium oxide, or the like is preferably used, and a single layer or stacked layers may be used. Owing to this, diffusion of impurities such as water or hydrogen from a lower layer into an upper layer through the conductors 440 and 310 can be inhibited. Note that it is preferable that the conductors 310a and 440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule). Furthermore, in the following description, the same applies to a conductive material having a function of inhibiting the passage of impurities. When the conductors 310a and 440a have a function of inhibiting the passage of oxygen, the conductivity of the conductors 310b and 440b can be prevented from being lowered because of oxidation.

The conductor 310b is preferably formed using a conductive material containing tungsten, copper, or aluminum as its main component. Although not illustrated, the conductor 310b may have a stacked-layer structure. For example, titanium, titanium nitride, and the above conductive material may be stacked as the conductor 310b.

The conductor 440b, which serves as a wiring, is preferably formed using a conductor having a higher conductivity than the conductor 310b; a conductive material including copper or aluminum as its main component can be used, for example. Although not illustrated, the conductor 440b may have a stacked-layer structure. For example, titanium, titanium nitride, and the above-described conductive material may be stacked as the conductor 440b.

The insulator 214 can serve as a barrier insulating film for preventing impurities such as water and hydrogen from entering the transistor from a lower layer. The insulator 214 is preferably formed using an insulating material having a function of inhibiting the passage of impurities such as water or hydrogen. For example, the insulator 214 is preferably formed using silicon nitride or the like. Accordingly, impurities such as water and hydrogen can be prevented from diffusing into layers over the insulator 214. Note that it is preferable that the insulator 214 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the passage of impurities.

Furthermore, the insulator 214 is preferably formed using an insulating material that has a function of inhibiting the passage of oxygen (e.g., an oxygen atom or an oxygen molecule). With this material, oxygen contained in the insulator 224 or the like can be inhibited from diffusing into lower layers.

Furthermore, with the structure in which the conductor 310 is stacked over the conductor 440, the insulator 214 can be provided between the conductor 440 and the conductor 310. Here, even when a metal that is easily diffused, such as copper, is used as the conductor 440b, silicon nitride or the like provided as the insulator 214 can prevent diffusion of the metal to a layer positioned above the insulator 214.

The insulator 222 is preferably formed using an insulating material that has a function of inhibiting the passage of oxygen and impurities such as water and hydrogen, and is preferably formed using aluminum oxide or hafnium oxide, for example. Accordingly, diffusion of impurities such as water and hydrogen from a layer under the insulator 222 into a layer over the insulator 222 can be inhibited. Furthermore, oxygen contained in the insulator 224 or the like can be inhibited from diffusing into lower layers.

Furthermore, the concentration of impurities such as water, hydrogen, or nitrogen oxide in the insulator 224 is preferably lowered. The amount of hydrogen released from the insulator 224 that is converted into hydrogen molecules per unit area of the insulator 224 is less than or equal to $2 \times 10^{15}$ molecules/cm$^2$, preferably less than or equal to $1 \times 10^{15}$ molecules/cm$^2$, and further preferably less than or equal to $5 \times 10^{14}$ molecules/cm$^2$ in thermal desorption spectroscopy (TDS) analysis in the range of 50° C. to 500° C., for example. The insulator 224 is preferably formed using an insulator from which oxygen is released by heating.

The insulator 412 can serve as a first gate insulating film. The insulators 220, 222, and 224 can serve as second gate insulating films. Although the insulator 220, the insulator 222, and the insulator 224 are stacked in the transistor 200, the present invention is not limited to this structure. For example, any two of the insulators 220, 222, and 224 may be stacked, or any one of the insulators may be used.

The metal oxide 406 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using a metal oxide has an extremely low leakage current in an off state; thus, a semiconductor device with low power consumption can be provided. A metal oxide can be formed by a sputtering method or the like and thus can be used in a transistor included in a highly integrated semiconductor device.

The metal oxide 406 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide or metal oxynitride.

Here, the atomic ratio of the element M to the constituent elements of the metal oxide 406a is preferably greater than that of the metal oxide 406b. Moreover, the atomic ratio of the element M to In in the metal oxide 406a is preferably greater than that in the metal oxide 406b. In addition, the atomic ratio of In to the element M in the metal oxide 406b is preferably greater than that in the metal oxide 406a.

It is preferable that the energy of the conduction band minimum of the metal oxide 406a be higher than the energy of the conduction band minimum of a region of the metal oxide 406b where the energy of the conduction band minimum is low. In other words, the electron affinity of the metal oxide 406a is preferably smaller than the electron affinity of the region of the metal oxide 406b where the energy of the conduction band minimum is low.

Here, the energy level of the conduction band minimum gradually changes in the metal oxides 406a and 406b. In other words, the energy level of the conduction band minimum is continuously varied or continuously connected. To obtain such an energy level, the density of defect states in a mixed layer formed at an interface between the metal oxides 406a and 406b is preferably made low.

Specifically, when the metal oxides 406a and 406b contain the same element (as a main component) in addition to oxygen, a mixed layer with a low density of defect states can be formed. For example, in the case where the metal oxide 406b is an In—Ga—Zn oxide, it is preferable to use an In—Ga—Zn oxide, a Ga—Zn oxide, gallium oxide, or the like as the metal oxide 406a.

At this time, a narrow-gap portion formed in the metal oxide 406b serves as a main carrier conduction path. Since the density of defect states at the interface between the metal oxides 406a and 406b is low, the influence of interface scattering on carrier conduction is small, and high on-state current can be obtained.

Furthermore, the metal oxide 406 includes a region 426a, a region 426b, and a region 426c. The region 426a is sandwiched between the region 426b and the region 426c as illustrated in FIG. 15B. The regions 426b and 426c are reduced in resistance through the formation of the insulator 225, and have higher conductivity than the region 426a. Impurity elements such as hydrogen and nitrogen, which are contained in an atmosphere where the insulator 225 is formed, are added to the regions 426b and 426c. Thus, owing to the added impurity element, oxygen vacancies are generated mainly in the regions of the metal oxide 406b that overlap with the insulator 225, and furthermore the impurity element enters the oxygen vacancies, which increases the carrier density and decreases the resistance.

Therefore, the concentration of at least one of hydrogen and nitrogen is preferably higher in the regions 426b and 426c than in the region 426a. The concentration of hydrogen or nitrogen can be measured by secondary ion mass spectrometry (SIMS) or the like. Here, the concentration of hydrogen or nitrogen in or near the middle of the region of the metal oxide 406b that overlaps with the insulator 412 (e.g., a portion in the metal oxide 406b which is located equidistant from both side surfaces in the channel length direction of the insulator 412) is measured as the concentration of hydrogen or nitrogen in the region 426a.

Note that the resistance of the region 426b and that of the region 426c are reduced by addition of an element that contributes to generation of oxygen vacancies or an element that can be bonded to oxygen vacancies. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon. Thus, the regions 426b and 426c include one or more of the above-described elements.

Furthermore, it is preferable in the metal oxide 406a that the atomic ratio of In to the element M in the regions 426b and 426c be substantially the same as that in the metal oxide 406b. In other words, in the metal oxide 406a, the atomic ratio of In to the element M in the region 426b and the region 426c is preferably larger than that in the region 426a. Here, when the indium content in the metal oxide 406 is increased, the resistance can be decreased. With this structure, even when the electric resistance of the metal oxide 406b is high, the region 426b and the region 426c in the metal oxide 406 can function as a source region and a drain region of the transistor 200 owing to the sufficiently reduced resistance of the metal oxide 406a in the region 426b and the region 426c.

Figure 16A:
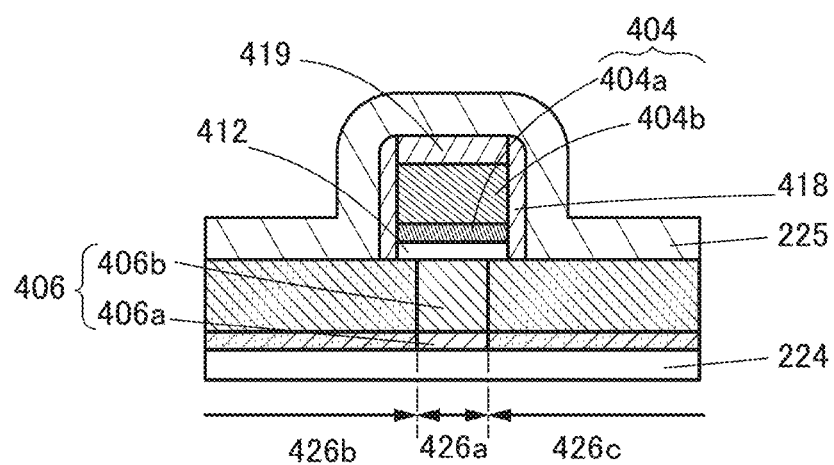
FIGS. 16A and 16B are cross-sectional views each illustrating a structure example of a transistor.

FIG. 16A is an enlarged view of the region 426a and the vicinity thereof in FIG. 15B. As illustrated in FIG. 16A, the region 426b and the region 426c are formed in at least the regions of the metal oxide 406 that overlap with the insulator 225. Here, one of the region 426b and the region 426c can function as a source region, and the other can function as a drain region. Moreover, the region 426a can function as a channel formation region.

Although the regions 426a, 426b, and 426c are formed in the metal oxides 406b and 406a in FIG. 15B and FIG. 16A, these regions may be formed at least in the metal oxide 406b. Furthermore, although a boundary between the region 426a and the region 426b and a boundary between the region 426a and the region 426c are illustrated as being substantially perpendicular to the top surface of the metal oxide 406 in FIG. 15B and the like, this embodiment is not limited to this structure. For example, in some cases, the region 426b and the region 426c project to the conductor 404 side in the vicinity of the surface of the metal oxide 406b and are recessed to the insulator 225 side in the vicinity of a bottom surface of the metal oxide 406a.

In the transistor 200, as illustrated in FIG. 16A, the region 426b and the region 426c are formed in the regions where the metal oxide 406 is in contact with the insulator 225 and the regions overlapping with the vicinity of end portions of the insulators 418 and 412. In that case, portions of the regions 426b and 426c that overlap with the conductor 404 serve as what we call overlap regions (also referred to as Lov regions). With the Lov regions, no high-resistance region is formed between the channel formation region and the source or drain region of the metal oxide 406; accordingly, the on-state current and the mobility of the transistor can be increased.

Figure 16B:
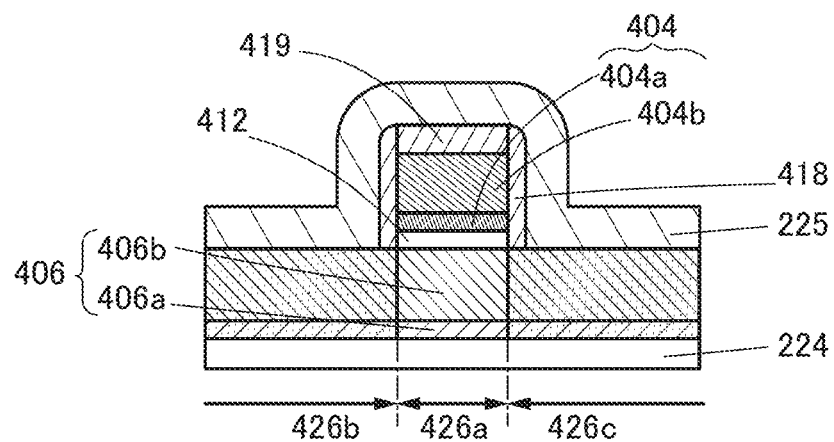

Note that the semiconductor device described in this embodiment is not limited thereto. For example, as illustrated in FIG. 16B, the region 426*b* and the region 426*c* may be formed in regions where the metal oxide 406 overlaps with the insulator 225 and the insulator 418. The structure illustrated in FIG. 16B can be rephrased as the structure in which the width of the conductor 404 in the channel length direction is substantially the same as the width of the region 426*a*. Since a high-resistance region is not formed between the source region and the drain region in the structure illustrated in FIG. 16B, the on-state current of the transistor can be increased. Since the gate does not overlap with the source and drain regions in the channel length direction in the structure illustrated in FIG. 16B, formation of unnecessary capacitance can be suppressed.

By appropriately selecting the areas of the regions 426*b* and 426*c* in the above manners, a transistor having desired electrical characteristics can be easily provided in accordance with the circuit design.

The insulator 412 is preferably provided in contact with the top surface of the metal oxide 406*b*. The insulator 412 is preferably formed using an insulator from which oxygen is released by heating. When the insulator 412 formed using the insulator is formed in contact with the top surface of the metal oxide 406*b*, oxygen can be supplied to the metal oxide 406*b* effectively. Furthermore, the concentration of impurities such as water and hydrogen in the insulator 412 is preferably lowered as in the insulator 224. The thickness of the insulator 412 is preferably 1 nm to 20 nm (e.g., approximately 1 nm).

The insulator 412 preferably contains oxygen. The amount of oxygen released from the insulator 412, which is converted into oxygen molecules per unit area of the insulator 412, is more than or equal to $1\times10^{14}$ molecules/cm$^2$, preferably more than or equal to $2\times10^{14}$ molecules/cm$^2$, further preferably more than or equal to $4\times10^{14}$ molecules/cm$^2$ in thermal desorption spectroscopy (TDS) in the range of the surface temperatures from 100° C. to 700° C. or from 100° C. to 500° C., for example.

The insulator 412, the conductor 404, and the insulator 419 each include a region overlapping with the metal oxide 406*b*. In addition, side surfaces of the insulator 412, the conductor 404*a*, the conductor 404*b*, and the insulator 419 are preferably aligned with each other.

The conductor 404*a* is preferably formed using a conductive oxide. For example, the metal oxide that can be used as the metal oxide 406*a* or the metal oxide 406*b* can be used. In particular, an In—Ga—Zn-based oxide with an atomic ratio of [In]:[Ga]:[Zn]=4:2:3 to 4:2:4.1 or in the neighborhood thereof, which has high conductivity, is preferably used. When the conductor 404*a* is formed using such a material, oxygen can be prevented from entering the conductor 404*b*, and an increase in electric resistance value of the conductor 404*b* due to oxidation can be prevented.

When such a conductive oxide is formed by a sputtering method, oxygen can be added to the insulator 412, so that oxygen can be supplied to the metal oxide 406*b*. Thus, oxygen vacancies in the region 426*a* of the metal oxide 406 can be reduced.

The conductor 404*b* can be formed using a metal such as tungsten, for example. It is also possible to use, as the conductor 404*b*, a conductor that can add impurities such as nitrogen to the conductor 404*a* to improve the conductivity of the conductor 404*a*. For example, titanium nitride or the like is preferably used for the conductor 404*b*. Alternatively, the conductor 404*b* may be a stack including a metal nitride such as titanium nitride and a metal such as tungsten thereover.

Here, the conductor 404 functioning as a gate electrode is provided to cover the top surface of the region 426*a* and its periphery and the side surfaces in the channel width direction of the metal oxide 406*b* with the insulator 412 interposed therebetween. Thus, the electric field of the conductor 404 functioning as a gate electrode can electrically surround the top surface of the region 426*a* and its periphery and the side surfaces in the channel width direction of the metal oxide 406*b*. The structure of the transistor in which the channel formation region is electrically surrounded by the electric field of the conductor 404 is referred to as a surrounded channel (s-channel) structure. Thus, a channel can be formed in the top surface of the region 426*a* and its periphery and the side surfaces in the channel width direction of the metal oxide 406*b*; therefore, a large amount of current can flow between the source and the drain, and current in an on state (on-state current) can be high. Moreover, since the top surface of the region 426*a* and its periphery and the side surfaces in the channel width direction of the metal oxide 406*b* are surrounded by the electric field of the conductor 404, a leakage current in an off state (off-state current) can be low.

The insulator 419 is preferably provided over the conductor 404*b*. In addition, it is preferable that side surfaces of the insulator 419, the conductor 404*a*, the conductor 404*b*, and the insulator 412 be substantially aligned with each other. The insulator 419 is preferably formed by an atomic layer deposition (ALD) method, in which case the thickness of the insulator 419 can be approximately 1 nm to 20 nm, preferably approximately 5 nm to 10 nm. The insulator 419 is preferably formed using an insulating material that has a function of inhibiting the passage of oxygen and impurities such as water or hydrogen, similarly to the insulator 418, and is preferably formed using aluminum oxide or hafnium oxide, for example.

When the insulator 419 is provided, the insulator 419 and the insulator 418 which have a function of inhibiting the passage of impurities such as water or hydrogen and oxygen can cover the top and side surfaces of the conductor 404. This can prevent entry of impurities such as water or hydrogen into the metal oxide 406 through the conductor 404. In this manner, the insulators 418 and 419 function as a gate cap for protecting the gate.

The insulator 418 is provided in contact with the side surfaces of the insulator 412, the conductor 404, and the insulator 419. Furthermore, the top surface of the insulator 418 is preferably aligned with the top surface of the insulator 419. The insulator 418 is preferably deposited by an ALD method, in which case the thickness of the insulator 418 can be approximately 1 nm to 20 nm, preferably approximately 1 nm to 3 nm (e.g., 1 nm).

As described above, the region 426*b* and the region 426*c* of the metal oxide 406 are formed with the impurity element added in the formation of the insulator 225. In the case where the transistor is miniaturized to have a channel length of approximately 10 nm to 30 nm, the impurity element contained in the source region or the drain region might be diffused to bring electrical connection between the source region and the drain region. In this embodiment, however, the insulator 418 can increase the distance between regions of the metal oxide 406 that are in contact with the insulator 225; accordingly, electrical connection between the source region and the drain region can be prevented. Furthermore, by using an ALD method, the insulator 418 can be formed to have a thickness that is as small as or smaller than the length of the miniaturized channel. Accordingly, an excessive increase of the distance between the source region and the drain region is not caused and thus an increase in the resistance can be prevented.

Here, the insulator 418 is preferably formed using an insulating material having a function of inhibiting the passage of impurities such as water or hydrogen and oxygen, and for example, is preferably formed using aluminum oxide or hafnium oxide. In that case, oxygen in the insulator 412 can be prevented from diffusing outward. Furthermore, entry of impurities such as hydrogen or water to the metal oxide 406 from an end portion or the like of the insulator 412 can be prevented.

The insulator 418 is preferably formed in the following manner: an insulating film is deposited by an ALD method and then subjected to anisotropic etching so that a portion of the insulator 418 in contact with the side surfaces of the insulator 412, the conductor 404, and the insulator 419 remains. Thus, an insulator having a small thickness as described above can be easily formed. At this time, even when the insulator 419 provided over the conductor 404 is partly removed by the anisotropic etching, the portion of the insulator 418 in contact with the insulator 412 and the conductor 404 can be left sufficiently.

The insulator 225 is provided to cover the insulator 419, the insulator 418, the metal oxide 406, and the insulator 224. Here, the insulator 225 is provided in contact with the top surfaces of the insulator 419 and the insulator 418 and the side surface of the insulator 418. As described above, impurities such as hydrogen or nitrogen are added from the insulator 225 to the metal oxide 406, so that the region 426b and the region 426c are formed. Thus, the insulator 225 preferably includes at least one of hydrogen and nitrogen.

Furthermore, the insulator 225 is preferably provided in contact with side surfaces of the metal oxides 406b and 406a as well as the top surface of the metal oxide 406b. This enables a resistance reduction to the side surfaces of the metal oxides 406b and 406a in the region 426b and the region 426c.

Moreover, the insulator 225 is preferably formed using an insulating material having a function of inhibiting the passage of impurities such as water or hydrogen and oxygen. For example, as the insulator 225, silicon nitride, silicon nitride oxide, silicon oxynitride, aluminum nitride, aluminum nitride oxide, or the like is preferably used. The insulator 225 formed using such a material can prevent oxygen from passing through the insulator 225 and being supplied to oxygen vacancies in the region 426b and the region 426c, so that a reduction in carrier density can be prevented. Furthermore, impurities such as water or hydrogen can be prevented from passing through the insulator 225 and excessively enlarging the region 426b and the region 426c to the region 426a side.

The insulator 280 is preferably provided over the insulator 225. Like the insulator 224 or the like, the concentration of impurities such as water or hydrogen in the insulator 280 is preferably lowered.

In openings formed in the insulator 280 and the insulator 225, a combination of a conductor 450a and a conductor 451a and a combination of a conductor 450b and a conductor 451b are provided. The combination of the conductor 450a and the conductor 451a and the combination of the conductor 450b and the conductor 451b are preferably provided with the conductor 404 sandwiched therebetween.

Here, the conductor 450a is formed in contact with an inner wall of the opening provided in the insulator 280 and the insulator 225, and the conductor 451a is further provided inside the conductor 450a. The region 426b of the metal oxide 406 is positioned in at least part of a bottom portion of the opening, and the conductor 450a is in contact with the region 426b. Similarly, the conductor 450b is formed in contact with an inner wall of the opening provided in the insulator 280 and the insulator 225, and the conductor 451b is further provided inside the conductor 450b. The region 426c of the metal oxide 406 is positioned in at least part of a bottom portion of the opening, and the conductor 450b is in contact with the region 426c.

Thus, the conductors 450a and 451a can serve as one of a source electrode and a drain electrode, and the conductors 450b and 451b can serve as the other of the source electrode and the drain electrode.

The conductor 450a and the conductor 450b are each preferably formed using a conductive material having a function of inhibiting the passage of impurities such as water or hydrogen, like the conductor 310a or the like. For example, tantalum, tantalum nitride, titanium, titanium nitride, ruthenium, ruthenium oxide, or the like is preferably used, and a single layer or stacked layers may be used. This can prevent entry of impurities such as hydrogen or water from a layer positioned over the insulator 280 to the metal oxide 406 through the conductor 451a and the conductor 451b.

Furthermore, the conductor 451a and the conductor 451b are preferably formed using a conductive material including tungsten, copper, or aluminum as its main component. Although not illustrated, the conductor 451a and the conductor 451b may have a stacked layer structure, and for example, stacked layers of titanium, titanium nitride, and the above-described conductive material may be used.

Next, components of the transistor 200 will be described.

<Substrate>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The above semiconductor substrate in which an insulator region is provided, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate has a small thickness, the weight of the semiconductor device including the transistor can be reduced. When the substrate has a small thickness, even a substrate of glass or the like may have elasticity or a property of returning to its original shape when bending or pulling is stopped. Therefore, an impact applied to the semiconductor device over the substrate due to dropping or the like can be reduced. That is, a durable semiconductor device can be provided.

For the substrate which is a flexible substrate, a metal, an alloy, a resin, glass, or a fiber thereof can be used, for example. The flexible substrate preferably has a lower coefficient of linear expansion, in which case deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

Note that when the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used for the insulator 222 and the insulator 214.

The insulator that has a function of inhibiting the passage of oxygen and impurities such as hydrogen can have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 222 and the insulator 214 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 222 and the insulator 214 preferably include aluminum oxide, hafnium oxide, or the like.

The insulator 384, the insulator 216, the insulator 220, the insulator 224, and the insulator 412 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 384, the insulator 216, the insulator 220, the insulator 224, and the insulator 412 each preferably include silicon oxide, silicon oxynitride, or silicon nitride.

It is preferable that the insulator 220, the insulator 222, the insulator 224, and/or the insulator 412 preferably include an insulator with a high relative dielectric constant. For example, it is preferable that the insulator 220, the insulator 222, the insulator 224, and/or the insulator 412 include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, it is preferable that the insulator 220, the insulator 222, the insulator 224, and/or the insulator 412 have a stacked-layer structure of silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide in each of the insulator 224 and the insulator 412 is positioned in contact with the metal oxide 406, silicon included in silicon oxide or silicon oxynitride can be prevented from entering the metal oxide 406. Furthermore, for example, when silicon oxide or silicon oxynitride in each of the insulator 224 and the insulator 412 is in contact with the metal oxide 406, trap centers might be formed at the interface between aluminum oxide, gallium oxide, or hafnium oxide and silicon oxide or silicon oxynitride. In some cases, the trap centers can shift the threshold voltage of the transistor in the positive direction by trapping electrons.

The insulator 384, the insulator 216, and the insulator 280 preferably include an insulator with a low relative dielectric constant. For example, the insulator 384, the insulator 216, and the insulator 280 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 384, the insulator 216, and the insulator 280 preferably have a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. When silicon oxide or silicon oxynitride, which is thermally stable, is combined with resin, the stacked-layer structure can have thermal stability and a low relative dielectric constant. Examples of the resin include polyester, polyolefin, polyamide (e.g., nylon or aramid), polyimide, polycarbonate, and acrylic.

As the insulator 418 and the insulator 419, an insulator having a function of suppressing the passage of oxygen and impurities such as hydrogen may be used. As the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

<Conductor>

The conductor 404a, the conductor 404b, the conductor 310a, the conductor 310b, the conductor 450a, the conductor 450b, the conductor 451a, and the conductor 451b can be formed using a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

As the above-described conductors, especially as the conductor 404a, the conductor 310a, the conductor 450a, and the conductor 450b, a conductive material including oxygen and a metal element included in a metal oxide that can be used for the metal oxide 406 may be used. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide 406 can be captured in some cases. Alternatively, hydrogen entering from an external insulator or the like can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When oxide is used for the channel formation region of the transistor, a stacked-layer structure formed using a combination of a material including any of the metal elements listed above and a conductive material including oxygen is preferably used for the gate electrode. In that case, the conductive material including oxygen is preferably provided on the channel formation region side so that oxygen released from the conductive material is easily supplied to the channel formation region.

<Metal Oxide that can be Used for Metal Oxide 406>

The metal oxide 406 according to the present invention is described below. As the metal oxide 406, a metal oxide functioning as an oxide semiconductor is preferably used.

The metal oxide 406 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 contains indium, the element M, and zinc is considered. The terms of the atomic ratio of indium to the element M and zinc of the metal oxide 406 are denoted by [In], [M], and [Zn], respectively.

Preferred ranges of the atomic ratio of indium to the element M and zinc of the metal oxide 406 are described with reference to FIGS. 17A to 17C. Note that the proportion of oxygen atoms is not shown in FIGS. 17A to 17C.

Figure 17A:
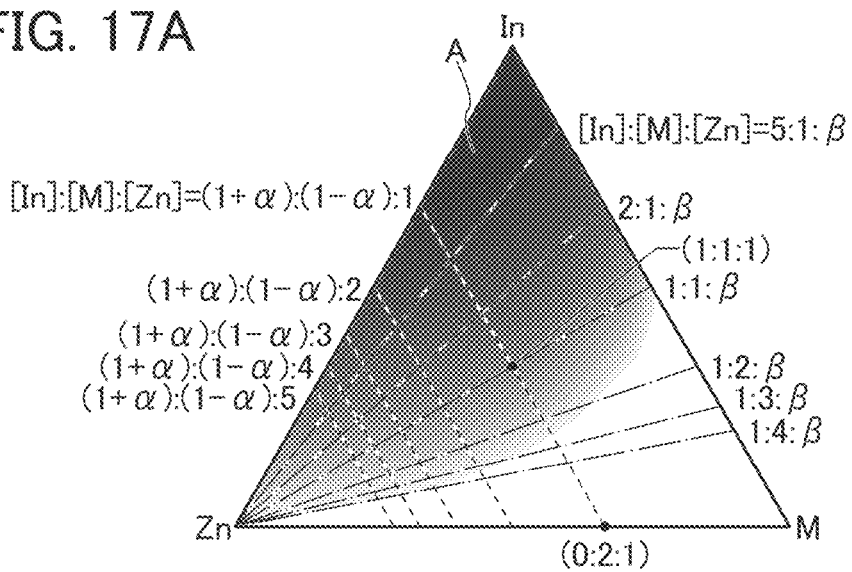
FIGS. 17A to 17C each illustrate an atomic ratio range of a metal oxide.
Figure 17B:
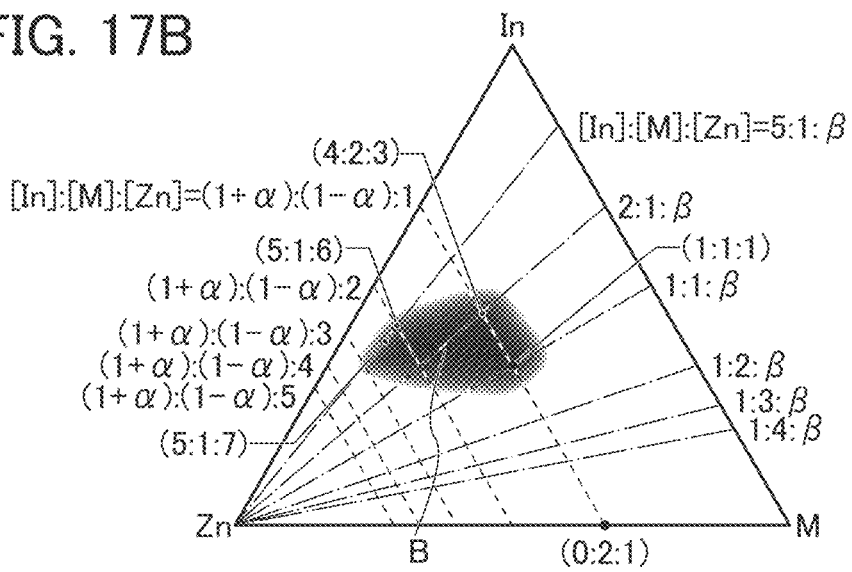
Figure 17C:
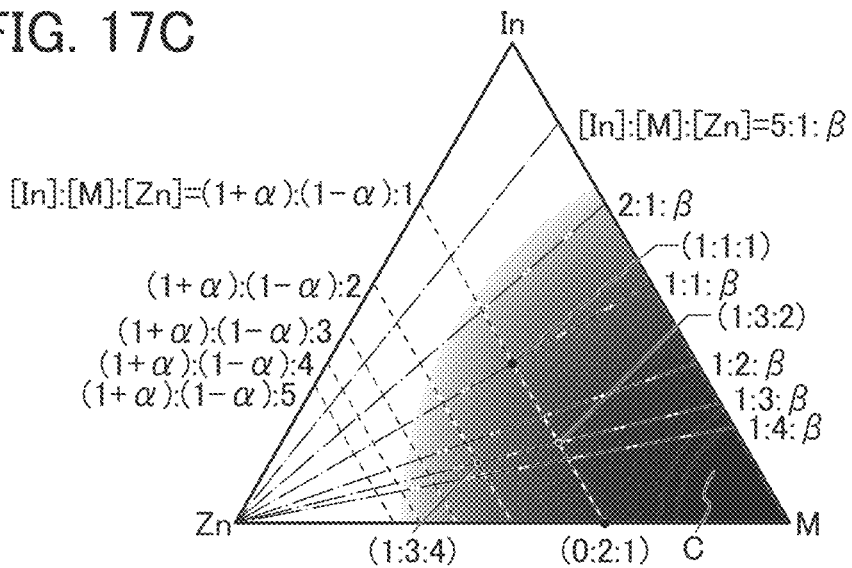

In FIGS. 17A to 17C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$ a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A metal oxide having the atomic ratio of [In]:[M]:[Zn]=0:2:1 or in the neighborhood thereof in FIGS. 17A to 17C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 17A represents an example of the preferred range of the atomic ratio of indium to the element M and zinc of the metal oxide 406.

The metal oxide having a higher content of indium can have higher carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 17C), insulating properties becomes better.

For example, the metal oxide used as the metal oxide 406b preferably has an atomic ratio represented by the region A in FIG. 17A. The metal oxide with the atomic ratio has high carrier mobility. The atomic ratio of In to Ga and Zn of the metal oxide used as the metal oxide 406b may be 4:2:3 to 4:2:4.1 or in the neighborhood thereof, for example. In contrast, the metal oxide used as the metal oxide 406a preferably has an atomic ratio represented by the region C in FIG. 17C. The metal oxide with the atomic ratio has relatively high insulating properties. The atomic ratio of In to Ga and Zn of the metal oxide used as the metal oxide 406a may be approximately 1:3:4, for example.

A metal oxide having an atomic ratio in the region A, particularly in a region B in FIG. 17B, has high carrier mobility and high reliability and is excellent.

Note that the region B includes an atomic ratio of [In]:[M]:[Zn]=4:2:3 to 4:2:4.1 and the neighborhood thereof. The neighborhood includes an atomic ratio of [In]:[M]:[Zn]=5:3:4. Note that the region B includes an atomic ratio of [In]:[M]:[Zn]=5:1:6 and the neighborhood thereof and an atomic ratio of [In]:[M]:[Zn]=5:1:7 and the neighborhood thereof.

In the case where the metal oxide 406 is formed of an In-M-Zn oxide, it is preferable to use a target including a polycrystalline In-M-Zn oxide as the sputtering target. Note that the atomic ratio of the formed metal oxide varies from the atomic ratio of metal elements of the sputtering target in a range of ±40%. For example, when a sputtering target with an atomic ratio of In:Ga:Zn=4:2:4.1 is used for forming the metal oxide 406, the atomic ratio of In to Ga and Zn in the formed metal oxide may be 4:2:3 or in the neighborhood thereof. When a sputtering target with an atomic ratio of In:Ga:Zn=5:1:7 is used for forming the metal oxide 406, the atomic ratio of In to Ga and Zn in the formed metal oxide may be 5:1:6 or in the neighborhood thereof.

Note that the properties of a metal oxide is not uniquely determined by an atomic ratio. Even with the same atomic ratio, the properties of a metal oxide might be different depending on a formation condition. For example, in the case where the metal oxide 406 is deposited with a sputtering apparatus, a film having an atomic ratio deviated from the atomic ratio of the target is formed. Depending on the substrate temperature in deposition, [Zn] in the film might be smaller than [Zn] in the target. Thus, the illustrated regions each represent an atomic ratio with which a metal oxide tends to have specific characteristics, and boundaries of the regions A to C are not clear.

<Composition of Metal Oxide>

Next, described are the compositions of a cloud-aligned composite oxide semiconductor (CAC-OS) and a CAC-metal oxide that can be used in an OS transistor.

In this specification and the like, "c-axis aligned crystal (CAAC)" or "cloud-aligned composite (CAC)" might be stated. CAAC refers to an example of a crystal structure, and CAC refers to an example of a function or a material composition.

A CAC-OS has a conducting function in a part of the material and has an insulating function in another part of the material; as a whole, the CAC-OS has a function of a semiconductor. In the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS includes components having different bandgaps. For example, the CAC-OS includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS is used in a channel region of a transistor, high current drive capability in the on state of the transistor, that is, high on-state current and high field-effect mobility, can be obtained.

The same applies to a CAC metal oxide. A CAC-OS or CAC-metal oxide can be called a matrix composite or a metal matrix composite.

<Structure of Metal Oxide>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. Formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. On the other hand, in the CAAC-OS, a clear grain boundary cannot be observed. Thus, a reduction in electron mobility due to the grain boundary is less likely to occur. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor can have various structures which show various properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the metal oxide is used for a transistor will be described.

When the metal oxide is used in a transistor, the transistor can have high field-effect mobility. In addition, the transistor can have high reliability.

Moreover, the carrier density in the region 426a in the transistor is preferably low. In order to reduce the carrier density of the metal oxide, the concentration of impurities in the metal oxide is reduced so that the density of defect states is reduced. In this specification and the like, a state with a low impurity concentration and a low density of defect states is referred to as a highly purified intrinsic or substantially highly purified intrinsic state. For example, the region 426a of the metal oxide 406b has a carrier density lower than $8\times10^{11}/cm^3$, preferably lower than $1\times10^{11}/cm^3$, further preferably lower than $1\times10^{10}/cm^3$ and higher than or equal to $1\times10^{-9}/cm^3$.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the region 426a. In addition, in order to reduce the concentration of impurities in the region 426a, the concentration of impurities in a film that is adjacent to the region 426a is preferably reduced. As examples of the impurities, hydrogen, nitrogen, alkali metal, alkaline earth metal, iron, nickel, silicon, and the like are given.

<Impurities>

Here, the influence of impurities in the metal oxide is described.

When silicon or carbon that is one of Group 14 elements is contained in the metal oxide, defect states are formed in the metal oxide. Thus, the concentration of silicon or carbon (the concentration is measured by SIMS) in the region 426a is set lower than or equal to $2\times10^{18}$ atoms/cm$^3$, or preferably lower than or equal to $2\times10^{17}$ atoms/cm$^3$.

When the metal oxide contains alkali metal or alkaline earth metal, defect states are formed and carriers are generated, in some cases. Thus, a transistor including the metal oxide that contains alkali metal or alkaline earth metal tends to have normally on characteristics. Therefore, it is preferable to reduce the concentration of alkali metal or alkaline earth metal in the region 426a. Specifically, the concentration of alkali metal or alkaline earth metal in the region 426a measured by SIMS is set lower than or equal to $1\times10^{18}$ atoms/cm$^3$, or preferably lower than or equal to $2\times10^{16}$ atoms/cm$^3$.

When the metal oxide contains nitrogen, the metal oxide easily becomes n-type by generation of electrons serving as carriers and an increase of carrier density. Thus, the transistor including nitrogen in the region 426a of the metal oxide 406b tends to have normally-on characteristics. For this reason, nitrogen in the region 426a of the metal oxide 406b is preferably reduced as much as possible; for example, the concentration of nitrogen in the region 426a of the metal oxide 406b measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, or still further preferably lower than or equal to $5\times10^{17}$ atoms/cm$^3$.

An electron serving as a carrier can be generated due to entry of hydrogen into the oxygen vacancy or due to bonding of part of hydrogen to oxygen bonded to a metal atom. Thus, a transistor including the channel that contains much hydrogen in the region 426a tends to have normally on characteristics. For this reason, hydrogen in the region 426a is preferably reduced as much as possible. Specifically, the concentration of hydrogen in the metal oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, or still further preferably lower than $1\times10^{18}$ atoms/cm$^3$.

By sufficiently reducing impurities in the region 426a of the metal oxide 406b, the transistor can have stable electrical characteristics.

<<Transistor 201>>

Next, the details of the transistor 201 illustrated in FIG. 14 will be described.

Figure 18A:
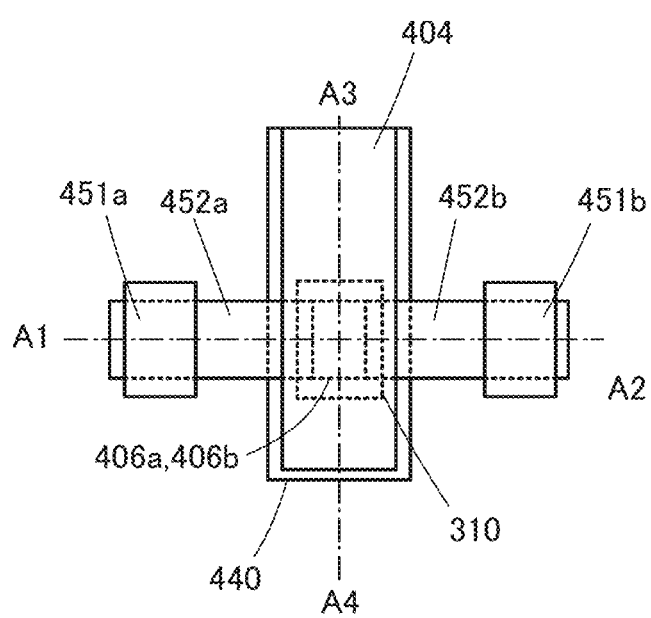
FIG. 18A is a top view illustrating a structure example of a transistor.
Figure 18C:
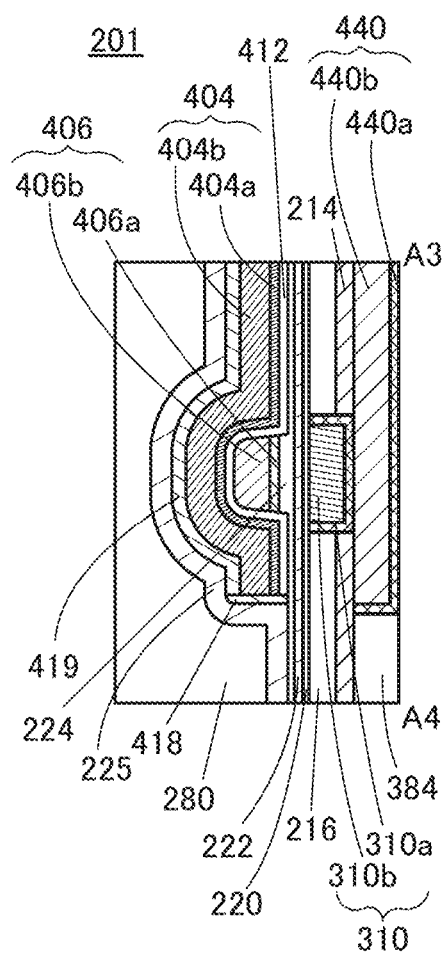
FIGS. 18B and 18C are cross-sectional views illustrating the structure example of the transistor.
Figure 18B:
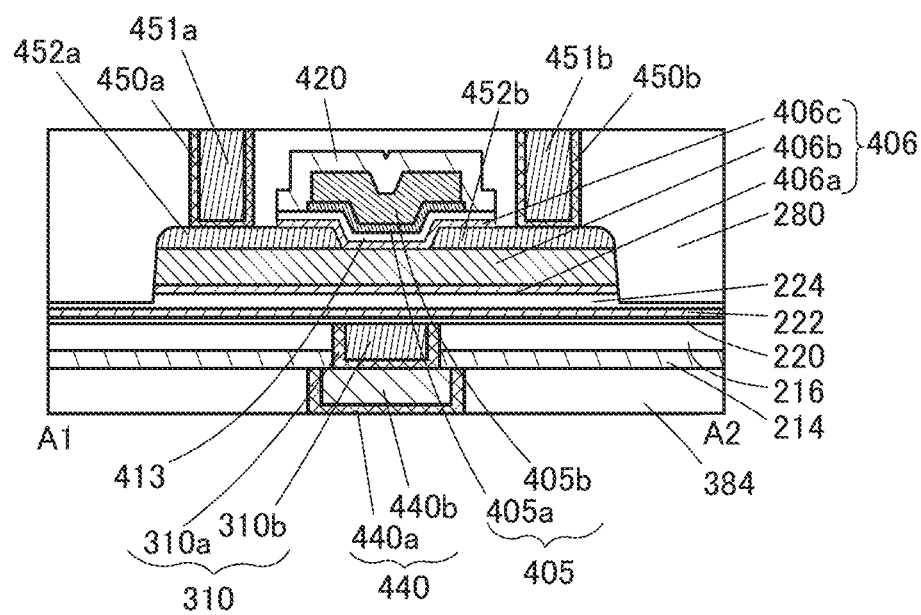

FIG. 18A is a top view of the transistor 201. FIG. 18B is a cross-sectional view taken along dashed-dotted line A1-A2 in FIG. 18A, which corresponds to a cross-sectional view in the channel length direction of the transistor 201. FIG. 18C is a cross-sectional view taken along dashed-dotted line A3-A4 in FIG. 18A, which corresponds to a cross-sectional view in the channel width direction of the transistor 201. Note that in the top view of FIG. 18A, some components are not illustrated for simplification of the drawings. The components common to the transistors 201 and 200 are denoted by the same reference numerals.

As illustrated in FIGS. 18B and 18C, the transistor 201 includes the insulator 224 over a substrate (not illustrated), the metal oxide 406a over the insulator 224, the metal oxide 406b in contact with at least part of the top surface of the metal oxide 406a, a conductor 452a and a conductor 452b in contact with at least part of the top surface of the metal oxide 406b, a metal oxide 406c in contact with at least part of the top surface of the metal oxide 406b and over the conductor 452a and the conductor 452b, an insulator 413 over the metal oxide 406c, a conductor 405a over the insulator 413, a conductor 405b over the conductor 405a, and an insulator 420 over the conductor 405b.

A conductor 405 (the conductor 405a and the conductor 405b) can function as a top gate, and the conductor 310 can function as a back gate. The potential of the back gate can be the same as the potential of the top gate, the ground potential, or an arbitrary potential. By changing the potential of the back gate independently of the potential of the top gate, the threshold voltage of the transistor can be changed.

The conductor 405a can be formed using a material that can be used for the conductor 404a illustrated in FIG. 15B.

The conductor 405b can be formed using a material that can be used for the conductor 404b illustrated in FIG. 15B.

The conductor 452a serves as one of a source electrode and a drain electrode, and the conductor 452b serves as the other of the source electrode and the drain electrode.

Any of metals such as aluminum, titanium, chromium, nickel, copper, yttrium, zirconium, molybdenum, silver, tantalum, and tungsten, or an alloy containing any of the metals as its main component can be used for the conductors 452a and 452b. Although a single-layer structure is illustrated in the drawings, a stacked-layer structure of two or more layers may be used. Further, a transparent conductive material containing indium oxide, tin oxide, or zinc oxide may be used.

In the transistor 201, a channel is preferably formed in the metal oxide 406b. Therefore, the metal oxide 406c is preferably formed using a material having a relatively higher insulating property than the metal oxide 406b. The metal oxide 406c can be formed using a material that can be used for the metal oxide 406a.

Providing the metal oxide 406c enables the transistor 201 to be a buried-channel transistor. Moreover, oxidation of end portions of the conductors 452a and 452b can be prevented. Furthermore, a leakage current between the conductor 405 and the conductor 452a (or between the conductor 405 and the conductor 452b) can be prevented. Note that the metal oxide 406c may be omitted depending on the case.

The insulator 420 is preferably formed using an insulating material having a function of inhibiting the passage of impurities such as water or hydrogen and oxygen. For example, the insulator 420 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride.

Providing the insulator 420 in the transistor 201 can prevent oxidation of the conductor 405. Furthermore, impurities such as water or hydrogen can be prevented from entering the metal oxide 406.

The transistor 201 can have a larger contact area between the metal oxide 406b and the electrode (the source electrode or the drain electrode) than the transistor 200. Furthermore, a step for forming the region 426b and the region 426c illustrated in FIGS. 15A to 15C is not necessary. Thus, the transistor 201 can have a larger on-state current than the transistor 200. In addition, the manufacturing process can be simplified.

For the details of the other components of the transistor 201, the description of the transistor 200 can be referred to.

Embodiment 4

This embodiment will describe embodiments of the semiconductor device in the above embodiments with reference to FIGS. 19A and 19B and FIGS. 20A and 20B.

<Semiconductor Wafer and Chip>

Figure 19A:
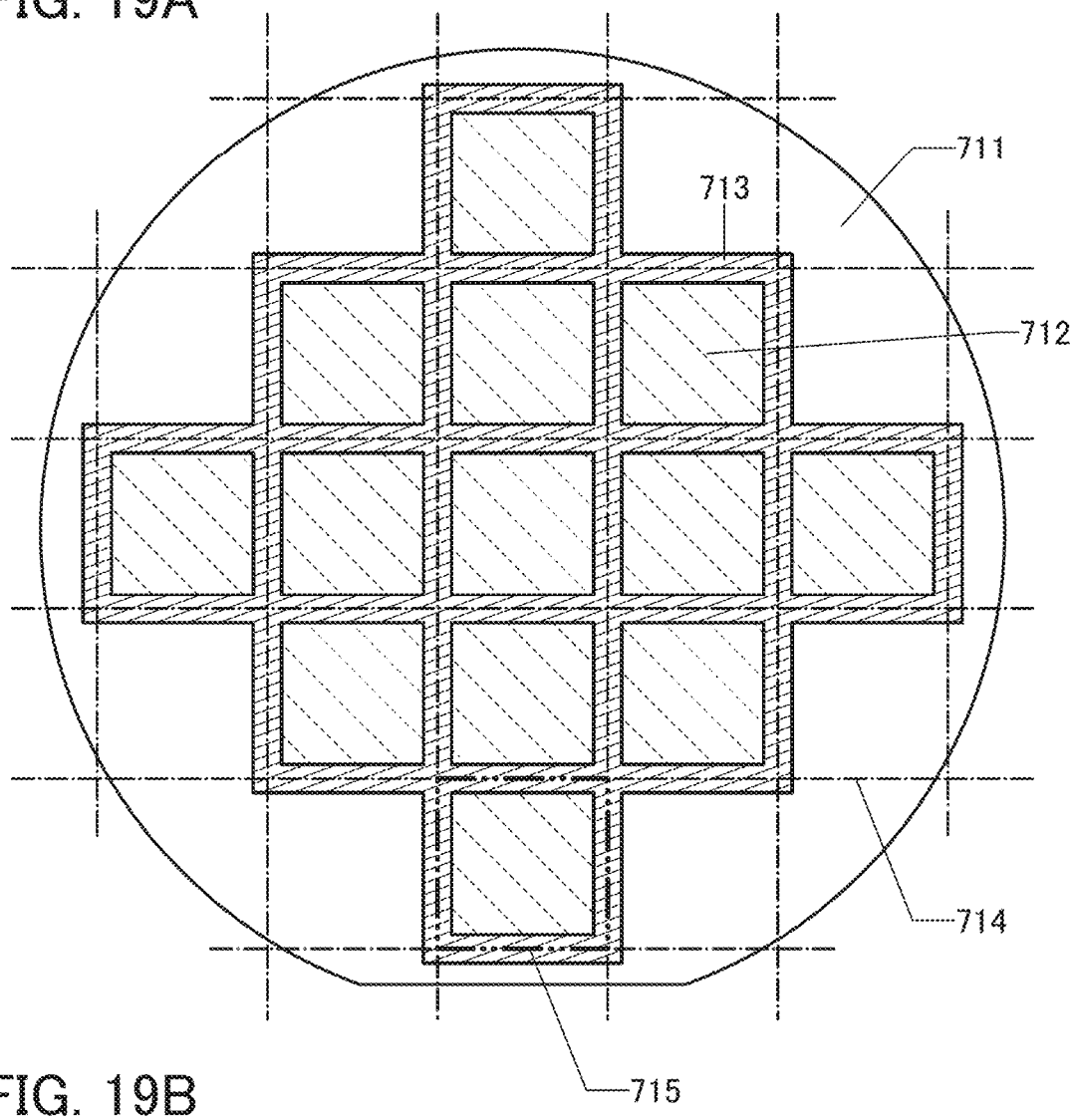
FIG. 19A is a top view illustrating a structure example of a semiconductor substrate.

FIG. 19A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 19B:
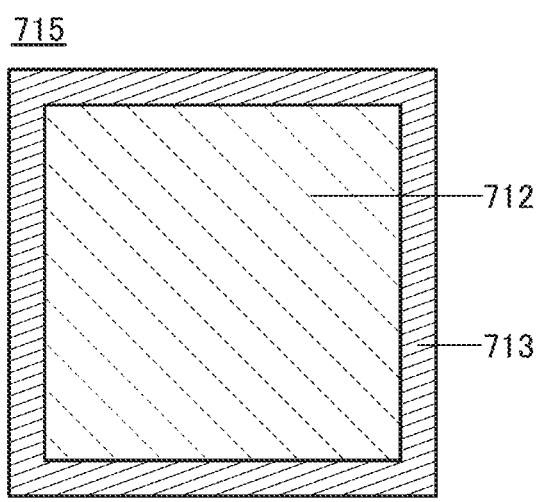
FIG. 19B is a plan view illustrating a structure example of a chip.

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 19B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.

<Electronic Component>

Figure 20A:
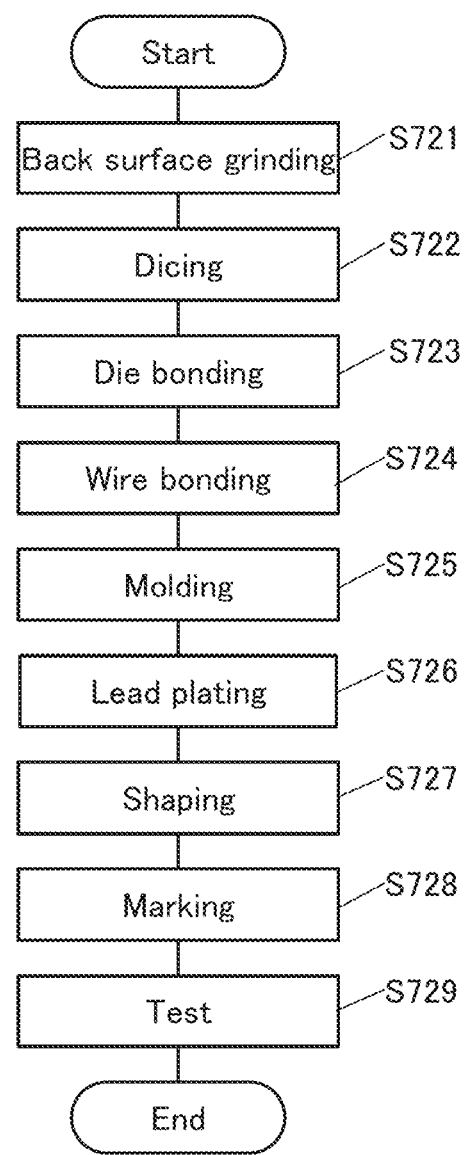
FIG. 20A is a flow chart for explaining an example of a manufacturing process of an electronic component.

An example of an electronic component using the chip 715 is described with reference to FIGS. 20A and 20B. Note that the electronic component is also referred to as a semiconductor package or an IC package. For electronic components, there are various standards, names, and the like depending on the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 20A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, a dicing step of dividing the substrate 711 into a plurality of chips 715 is performed (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a sealing (molding) step of sealing the chip with an epoxy resin or the like (Step S725). Through the sealing step, the inside of the electronic component is filled with a resin, so that the wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating treatment, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 20B:
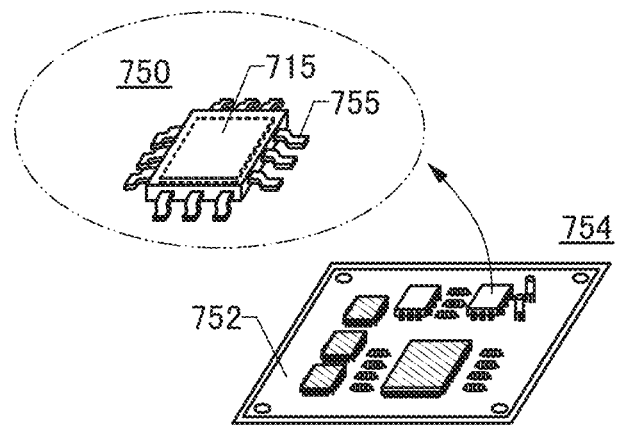
FIG. 20B is a schematic perspective view illustrating a configuration example of the electronic component.

FIG. 20B is a schematic perspective view of the completed electronic component. FIG. 20B illustrates a schematic perspective view of a quad flat package (QFP) as an example of the electronic component. An electronic component 750 in FIG. 20B includes a lead 755 and the chip 715. The electronic component 750 may include a plurality of chips 715.

The electronic component 750 in FIG. 20B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 5

<Electronic Device>

The programmable logic device described in the above embodiments can be employed in various electronic devices. FIGS. 21A to 21F each illustrate a specific example of an electronic device including the PLD 80. The electronic devices in FIGS. 21A to 21F each can have reduced power consumption with the use of the PLD 80.

Figure 21A:
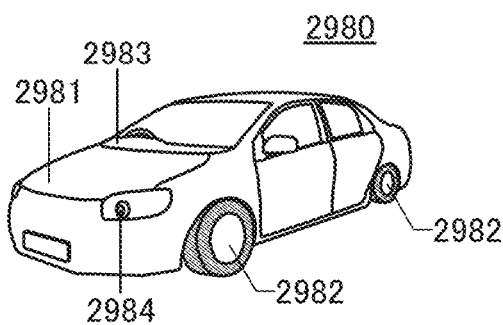
FIGS. 21A to 21F illustrate examples of electronic devices.

FIG. 21A is an external view illustrating an example of a car. A car 2980 includes a car body 2981, wheels 2982, a dashboard 2983, lights 2984, and the like. The car 2980 includes an antenna, a battery, and the like.

Figure 21B:
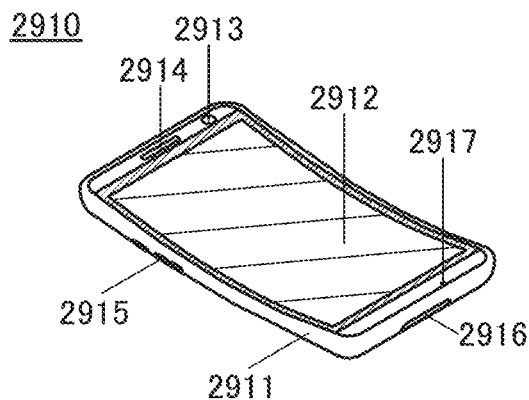

An information terminal 2910 illustrated in FIG. 21B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 21C:
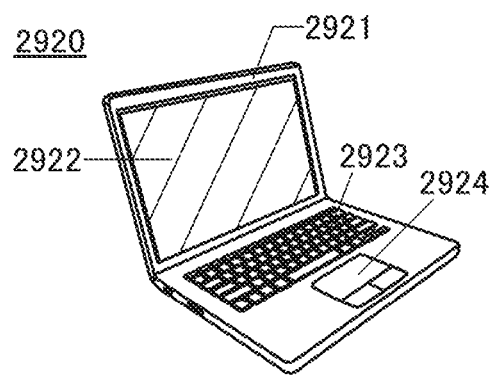

A notebook personal computer 2920 illustrated in FIG. 21C includes a housing 2921, a display portion 2922, a keyboard 2923, a pointing device 2924, and the like. In addition, the notebook personal computer 2920 includes an antenna, a battery, and the like inside the housing 2921.

Figure 21D:
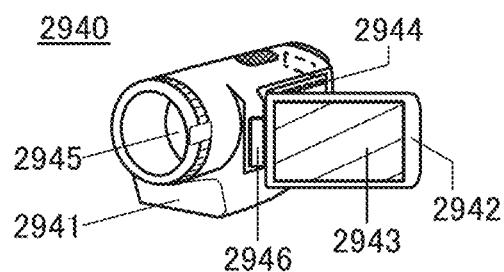

A video camera 2940 in FIG. 21D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 21E:
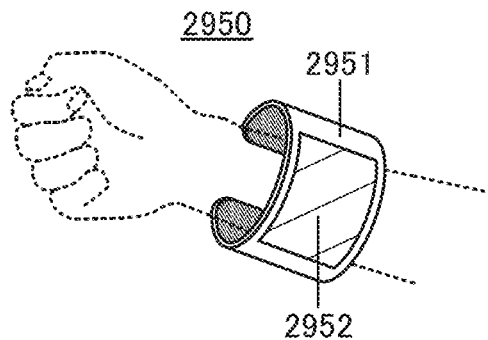

FIG. 21E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 21F:
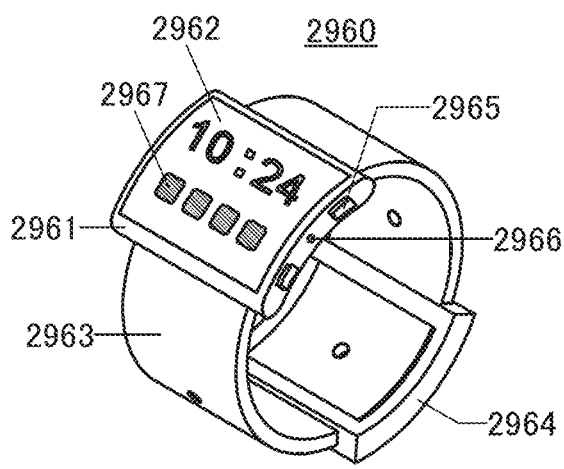

FIG. 21F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Unless otherwise specified, on-state current in this specification refers to drain current of a transistor in an on state. Unless otherwise specified, the on state (also sometimes abbreviated to "on") of an n-channel transistor means that the voltage between its gate and source ($V_G$) is higher than or equal to the threshold voltage ($V_{th}$), and the on state of a p-channel transistor means that $V_G$ is lower than or equal to $V_{th}$. For example, the on-state current of an n-channel transistor refers to a drain current that flows when $V_G$ is higher than or equal to $V_{th}$. The on-state current of a transistor depends on a voltage VD between a drain and a source in some cases.

Unless otherwise specified, an off-state current in this specification refers to a drain current of a transistor in an off state. Unless otherwise specified, the off state (also sometimes abbreviated to "off") of an n-channel transistor means that $V_G$ is lower than $V_{th}$, and the off state of a p-channel transistor means that $V_G$ is higher than $V_{th}$. For example, the off-state current of an n-channel transistor refers to a drain current that flows when $V_G$ is lower than $V_{th}$. The off-state current of a transistor depends on $V_G$ in some cases. Thus, "the off-state current of a transistor is lower than $10^{-21}$ A"

may mean there is $V_G$ at which the off-state current of the transistor is lower than $10^{-21}$ A.

The off-state current of a transistor depends on VD in some cases. Unless otherwise specified, the off-state current in this specification may be off-state current at VD with an absolute value of 0.1 V, 0.8 V, 1V, 1.2V, 1.8 V, 2.5 V, 3V, 3.3 V, 10 V, 12V, 16V, or 20V. Alternatively, the off-state current may be off-state current at VD used in a semiconductor device or the like including the transistor.

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, when it is explicitly described that X and Y are connected, the case where X and Y are electrically connected and the case where X and Y are directly connected are included therein.

Here, X and Y each denote an object (e.g., a device, an element, a circuit, a wiring, an electrode, a terminal, a conductive film, or a layer).

For example, in the case where X and Y are directly connected, X and Y are connected without an element that allows electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

REFERENCE NUMERALS

C1, C2: capacitor; I1, I2: inverter; M1, M2, M3, M4, M5, M6, M7, M8, M9, M10, M11, M12, Tr11, Tr12, Tr13, Tr14, Tr15, Tr16, Tr17, Tr18, Tr20, Tr24: transistor; N1, N2: node; 10, 13, 20, 20_R, 20_S: semiconductor device; 11: latch circuit; 12: memory circuit; 34: OR circuit; 40: lookup table (LUT); 41: OR circuit; 42, 43, 44: AND circuit; 50: configuration memory (CM); 51, 52: inverter; 60: buffer (BUF); 61: circuit; 70: programmable switch element (PSE); 80: programmable logic device (PLD); 100: semiconductor device; 110, 112, 120, 218, 246, 248, 310, 310a, 310b, 316, 328, 330, 356, 376, 366, 386, 404, 404a, 404b, 405, 405a, 405b, 440, 440a, 440b, 450a, 450b, 451a, 451b, 452a, 452b: conductor; 130, 150, 214, 216, 220, 222, 224, 225, 250, 280, 282, 286, 315, 320, 322, 324, 326, 350, 352, 354, 360, 362, 364, 370, 372, 374, 380, 382, 384, 412, 413, 418, 419, 420: insulator; 140: capacitor; 200, 201, 300: transistor; 311: substrate; 313: semiconductor region; 314a, 314b: low-resistance region; 406, 406a, 406b, 406c: metal oxide; 426a, 426b, 426c: region; 711: substrate; 712: circuit region; 713: isolation region; 714: separation line; 715: chip; 750: electronic component; 752: printed circuit board; 754: circuit board; 755: lead; 2910: information terminal; 2911: housing; 2912: display portion; 2913: camera; 2914: speaker portion; 2915: operation switch; 2916: external connection portion; 2917: microphone; 2920: notebook personal computer; 2921: housing; 2922: display portion; 2923: keyboard; 2924: pointing device; 2940: video camera; 2941, 2942: housing; 2943: display portion; 2944: operation switch; 2945: lens; 2946: connection portion; 2950: information terminal; 2951: housing; 2952: display portion; 2960: information terminal; 2961: housing; 2962: display portion; 2963: band; 2964: buckle; 2965: operation switch; 2966: input/output terminal; 2967: icon; 2980: car; 2981: car body; 2982: wheel; 2983: dashboard; and 2984: light.

This application is based on Japanese Patent Application Serial No. 2016-252694 filed with Japan Patent Office on Dec. 27, 2016, the entire contents of which are hereby incorporated by reference.

The invention claimed is:

1. A semiconductor device comprising:
a lookup table comprising a memory;
a first circuit; and
a second circuit,
wherein the first circuit receives a first signal and a second signal,
wherein the second circuit sends a third signal,
wherein when the first circuit receives the third signal, the first circuit sends a fourth signal and a fifth signal,
wherein when the lookup table receives the fourth signal and the fifth signal, the lookup table sends a sixth signal and a seventh signal,
wherein when the second circuit receives the sixth signal and the seventh signal, the second circuit sends an eighth signal,
wherein when the first circuit receives the eighth signal, the first circuit sends a ninth signal, and
wherein the sixth signal and the seventh signal are generated from data stored in the memory.

2. The semiconductor device according to claim 1, wherein supply of a power supply voltage to the lookup table is stopped by the ninth signal.

3. The semiconductor device according to claim 1, wherein the memory comprises a transistor containing a metal oxide in a channel formation region of the transistor.

4. The semiconductor device according to claim 1, wherein each of the first circuit and the second circuit comprises:
a first transistor being an n-channel transistor;
a second transistor being an n-channel transistor;
a third transistor being a p-channel transistor;
a fourth transistor being a p-channel transistor;
a latch circuit comprising a first node and a second node; and
a memory circuit,
wherein one of a source and a drain of the first transistor is supplied with a low power supply potential,
wherein the other of the source and the drain of the first transistor is electrically connected to one of a source and a drain of the second transistor,
wherein the other of the source and the drain of the second transistor is electrically connected to the first node and one of a source and a drain of the third transistor,
wherein the other of the source and the drain of the third transistor is electrically connected to one of a source and a drain of the fourth transistor, wherein the other of the source and the drain of the fourth transistor is supplied with a high power supply potential, wherein a gate of the first transistor is electrically connected to a gate of the fourth transistor, wherein a gate of the second transistor is electrically connected to a gate of the third transistor, wherein the second node is supplied with an inverted signal of a signal supplied to the first node, and wherein the memory circuit is configured to store data that the latch circuit stores before supply of a power supply voltage to the latch circuit is stopped, while the supply of the power supply voltage is stopped.

5. The semiconductor device according to claim 1, wherein each of the first circuit and the second circuit comprises:
a first transistor;
a second transistor;
a third transistor;
a fourth transistor;
a first wiring for supplying a low power supply potential;
a second wiring for supplying a high power supply potential;
a latch circuit comprising a first node and a second node; and
a memory circuit comprising a first capacitor and a second capacitor, wherein data stored in the first node and data stored in the second node are inverted from each other, wherein the data stored in the first node and the data stored in the second node are saved in the first capacitor and the second capacitor, wherein the first transistor, the second transistor, the third transistor, and the fourth transistor are electrically connected to each other in series between the first wiring and the second wiring, and wherein a connection node of the second transistor and the third transistor is electrically connected the first node.

6. The semiconductor device according to claim 4, wherein the memory circuit comprises a transistor containing a metal oxide in a channel formation region of the transistor.

7. A programmable logic device comprising:
a programmable logic element comprising the semiconductor device according to claim 1; and
a programmable switch element.

8. The semiconductor device according to claim 1, wherein the fourth signal has the same logic as the first signal, and
wherein the fifth signal has the same logic as the second signal.

9. A semiconductor device comprising:
a lookup table comprising a memory;
a first circuit; and
a second circuit,
wherein the memory comprises a transistor containing a metal oxide in a channel formation region of the transistor, wherein the first circuit comprising a first input terminal, a second input terminal, a third input terminal, a first output terminal, a second output terminal and a third output terminal, wherein the second circuit comprising a fourth input terminal, and a fifth input terminal and a fourth output terminal, wherein the lookup table comprising a sixth input terminal, a seventh input terminal, a fifth output terminal and a sixth output terminal, wherein the first output terminal is electrically connected to the sixth input terminal, wherein the second output terminal is electrically connected to the seventh input terminal, wherein the fourth output terminal is electrically connected to the third input terminal, wherein the fifth output terminal is electrically connected to the fourth input terminal, and wherein the sixth output terminal is electrically connected to the fifth input terminal.

10. The semiconductor device according to claim 9, wherein each of the first circuit and the second circuit comprises:
a first transistor;
a second transistor;
a third transistor;
a fourth transistor;
a first wiring for supplying a low power supply potential;
a second wiring for supplying a high power supply potential;
a latch circuit comprising a first node and a second node; and
a memory circuit comprising a first capacitor and a second capacitor.

11. An operation method of a semiconductor device comprising a lookup table, a first circuit, and a second circuit, the operation method comprising:
receiving a first signal and a second signal in the first circuit;
sending a third signal from the second circuit;
sending a fourth signal and a fifth signal from the first circuit when the first circuit receives the third signal;
sending a sixth signal and a seventh signal from the lookup table when the lookup table receives the fourth signal and the fifth signal;
sending an eighth signal from the second circuit when the second signal receives the sixth signal and the seventh signal; and
sending a ninth signal from the first circuit when the first circuit receives the eighth signal,
wherein the fourth signal has the same logic as the first signal,
wherein the fifth signal has the same logic as the second signal,
wherein the lookup table comprises a memory, and
wherein the sixth signal and the seventh signal are generated from data stored in the memory.

12. The operation method of the semiconductor device according to claim 11, wherein supply of a power supply voltage to the lookup table is stopped by the ninth signal.

* * * * *